(12) United States Patent
Jacobson et al.

(10) Patent No.: US 6,175,652 B1
(45) Date of Patent: Jan. 16, 2001

(54) MACHINE VISION SYSTEM FOR ANALYZING FEATURES BASED ON MULTIPLE OBJECT IMAGES

(75) Inventors: Lowell D. Jacobson, Grafton; Vladimir N. Ruzhitsky, Brookline, both of MA (US)

(73) Assignee: Cognex Corporation, Natick, MA (US)

( * ) Notice: Under 35 U.S.C. 154(b), the term of this patent shall be extended for 0 days.

(21) Appl. No.: 09/002,190

(22) Filed: Dec. 31, 1997

(51) Int. Cl.⁷ .............................. G06K 9/46; G06K 9/62; G06K 9/68; C30B 15/00; H04N 13/02

(52) U.S. Cl. .................... 382/216; 382/203; 382/209; 382/219; 382/278; 117/14; 348/50

(58) Field of Search ................................ 382/181, 209, 382/216, 219, 294, 203, 278; 348/43, 50, 159; 117/14, 201

(56) References Cited

U.S. PATENT DOCUMENTS

| | | | |
|---|---|---|---|
| 3,740,563 | 6/1973 | Reichard | 250/222 |
| 4,277,441 | 7/1981 | Sachs | 422/105 |
| 4,519,041 | 5/1985 | Fant et al. | 364/552 |
| 4,587,617 | 5/1986 | Barker et al. | 364/507 |
| 4,618,989 | 10/1986 | Tsukune et al. | 382/25 |
| 4,760,604 | 7/1988 | Cooper et al. | 382/15 |
| 4,832,496 | 5/1989 | Thomas | 356/384 |
| 5,179,419 | 1/1993 | Palmquist et al. | 356/73.1 |
| 5,189,711 | 2/1993 | Weiss et al. | 382/25 |
| 5,331,413 * | 7/1994 | Diner | 348/159 |
| 5,426,684 | 6/1995 | Gaborski et al. | 378/62 |
| 5,437,242 | 8/1995 | Hofstetter et al. | 117/14 |
| 5,625,702 | 4/1997 | Kamada et al. | 382/107 |
| 5,653,799 | 8/1997 | Fuerhoff | 117/14 |
| 5,656,078 * | 8/1997 | Fuerhoff | 117/201 |
| 5,730,026 | 3/1998 | Maatuk | 73/295 |

(List continued on next page.)

OTHER PUBLICATIONS

Cognex corp. "High–Performance Mahine Vision for The VMEbus", pp. 1–8, no date.*

Chiou et al., "A Neural Network–Based Stochastic Active Contour Model (NNS–SNAKE) for Contour Finding of Distinct Features," IEEE Trans. On Image Processing, vol. 4, No. 10, Oct. 1995, pp. 1407–1416.

(List continued on next page.)

*Primary Examiner*—Phuoc Tran
*Assistant Examiner*—Daniel G. Mariam
(74) *Attorney, Agent, or Firm*—Theresa A. Lober

(57) ABSTRACT

Provided is the ability to produce an orthogonal-view representation of a selected feature plane of a three-dimensional object. A plurality of images of the object are acquired, each corresponding to a distinct orientation of the object about a selected object axis. In at least one acquired image, feature points are identified in the selected feature plane as-projected into that acquired image. Feature points are associated with an orthogonal-view representation of the selected feature plane, and feature points from at least one acquired image are correlated with physical orientations on the selected feature plane based on the object orientation corresponding to that acquired image. An orthogonal-view representation of the selected object feature plane can be analyzed for a specified feature configuration even when the acquired object images are perspective-view images. This can be accomplished even through only a subset of feature points may be available in any one given image of the object. Such may be the case, e.g., where portions of a complicated three-dimensional object obscure other portions of the object in a selected view of the object. Also provided is an ability to analyze an orthogonal-view representation of a circumferential object contour, e.g., a meniscus defined on a semiconductor melt surface from which a semiconductor crystal ingot is horizontally pulled to grow the crystal ingot. The invention enables monitoring of the crystal growth for faults occurring during the growth process.

38 Claims, 13 Drawing Sheets

U.S. PATENT DOCUMENTS

| | | | |
|---|---|---|---|
| 5,734,742 | 3/1998 | Asaeda et al. | 382/141 |
| 5,734,751 | 3/1998 | Saito | 382/203 |
| 5,882,402 * | 3/1999 | Fuerhoff | 117/201 |
| 5,892,538 * | 4/1999 | Gibas | 348/43 |

OTHER PUBLICATIONS

Jacobson, "Conjoint Image Representation and its Application to Viewpoint Invariant Form Recognition and Optical Flow Estimation," Thesis, University of Minnesota, Feb. 1987, pp. 75–76.

Isys, a Cognex Company, iLearn Classifier, Technical Product Bulletin.

Press et al., *Numerical Recipes in C, The Art of Scientific Computing*, Cambridge University Press, 1988, pp. 290–324.

* cited by examiner

To Fig. 4-2

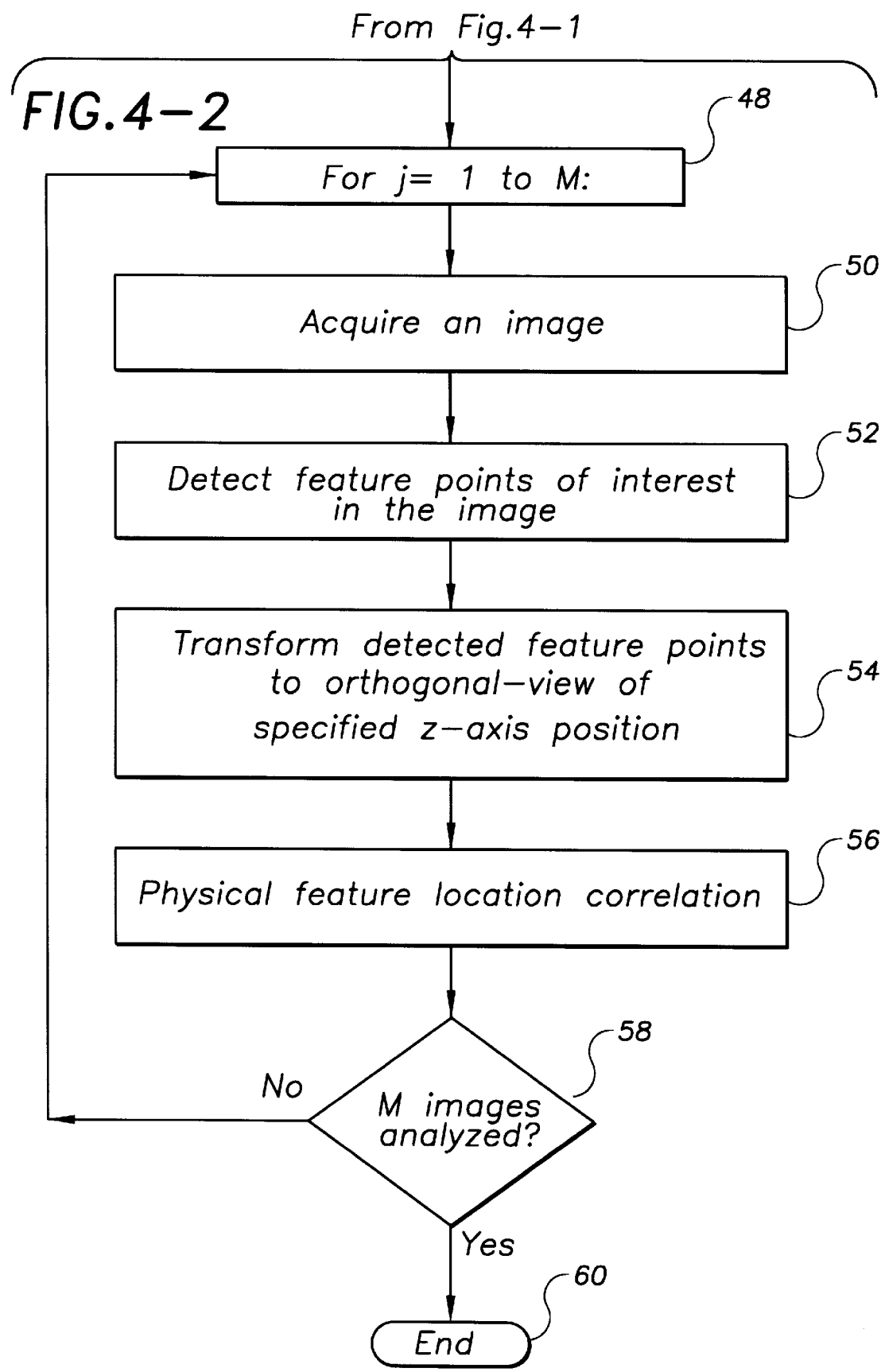

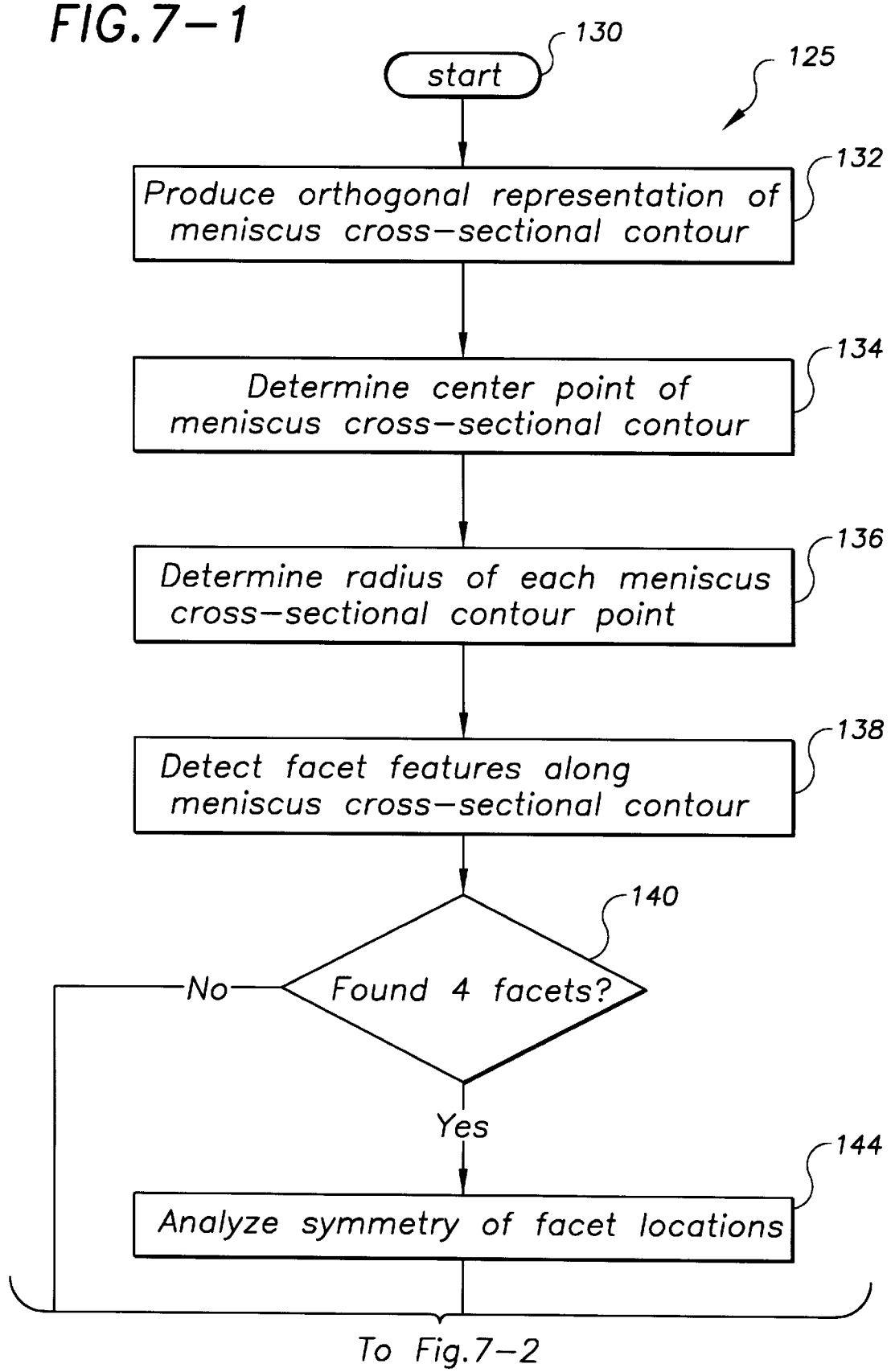

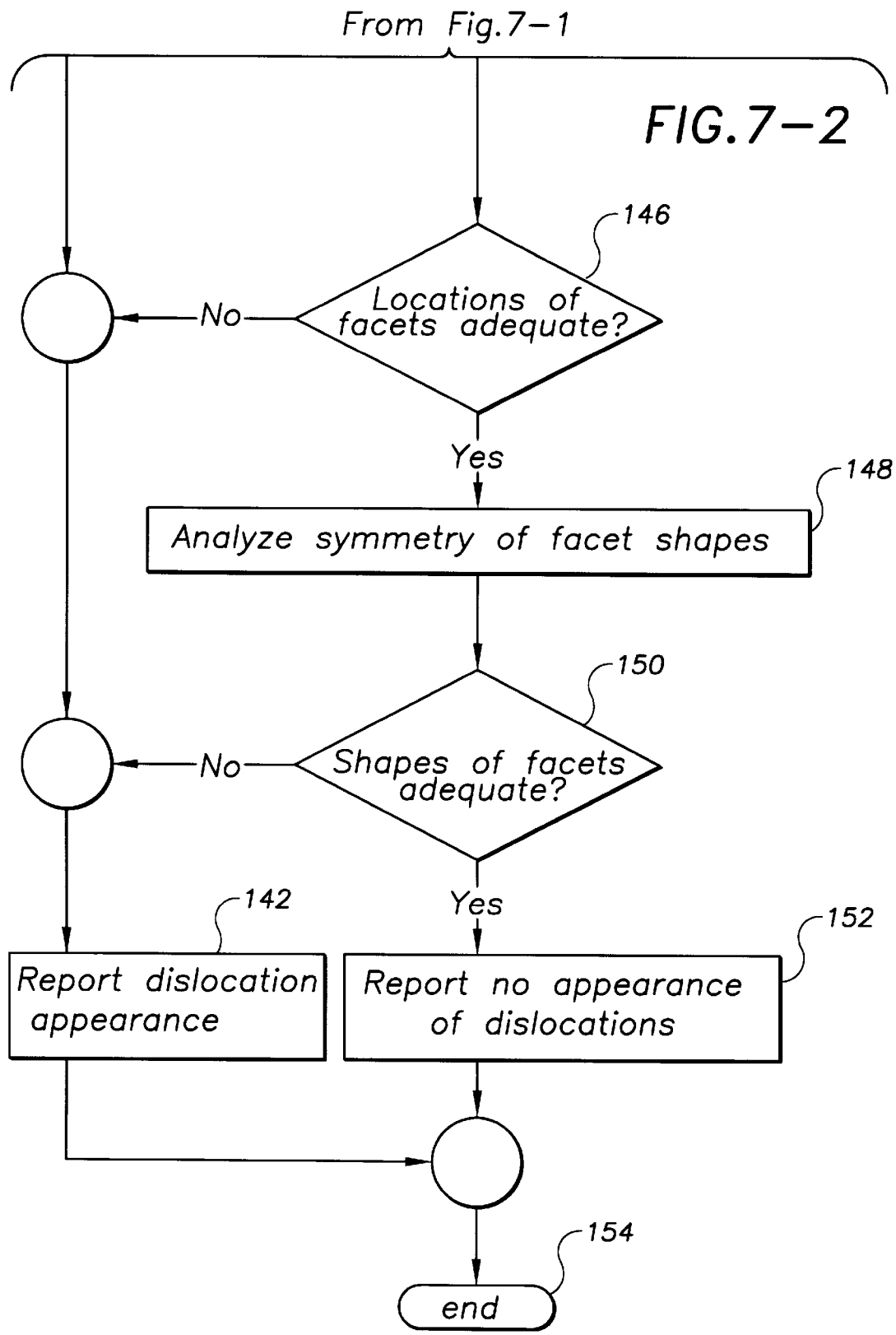

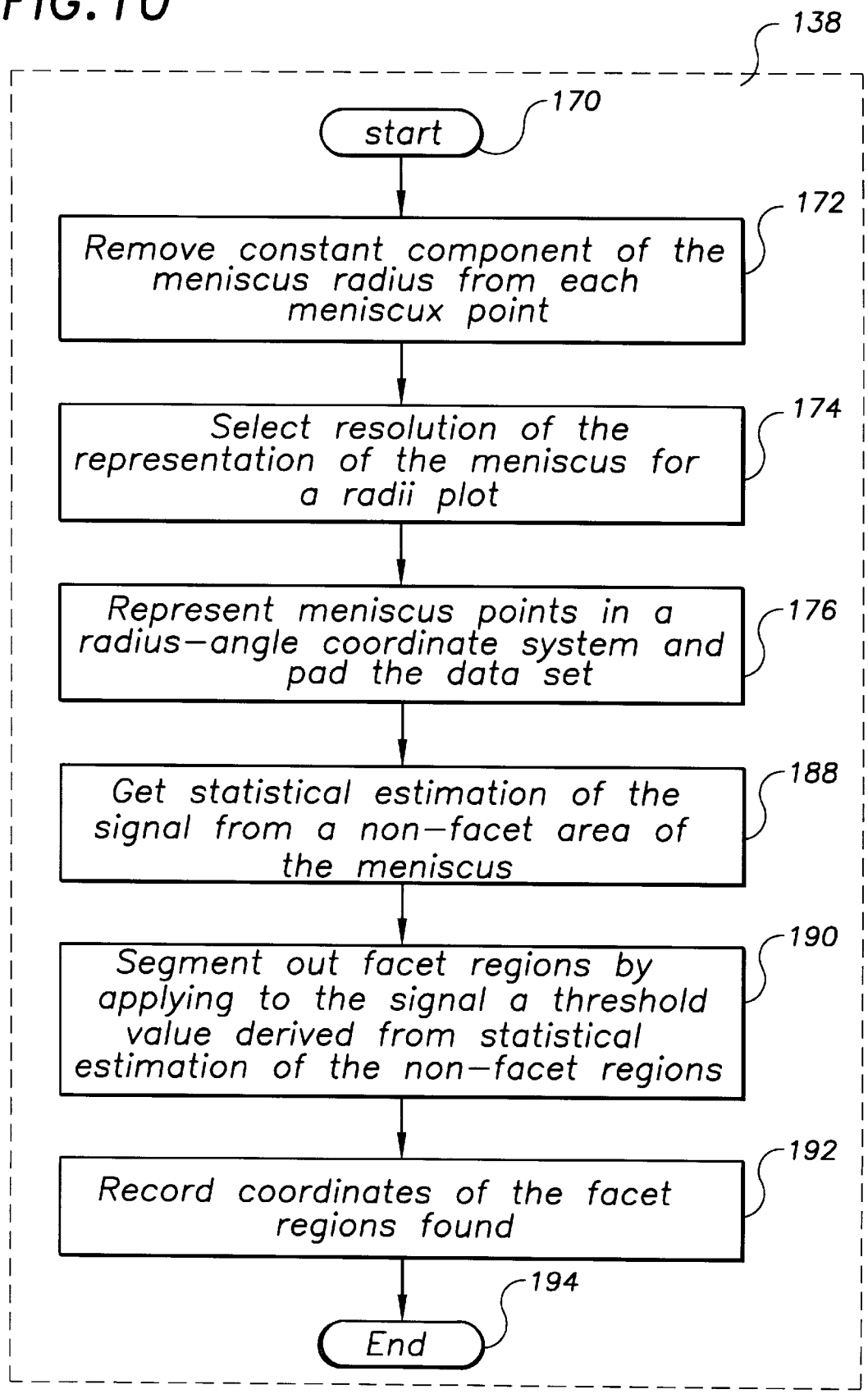

MACHINE VISION SYSTEM FOR ANALYZING FEATURES BASED ON MULTIPLE OBJECT IMAGES

FIELD OF THE INVENTION

This invention relates to machine vision for industrial processes, and more particularly relates to machine vision techniques for analyzing feature information about an object based on an acquired image of the object.

BACKGROUND OF THE INVENTION

Machine vision systems are increasingly employed to replace human vision in a wide range of industrial processes such as manufacturing operations. A machine vision system typically provides automated, computer-based image acquisition and analysis capabilities that can be employed for tasks such as measurement and inspection of parts or materials. For such tasks, a machine vision system typically is configured with a camera for acquiring an image of an object of interest, e.g., a part being produced, and further is configured with processing functionality to process the acquired image and produce information about the object. Frequently, in measurement and inspection tasks, the object image acquisition is tailored to include specific object features that are of interest for a given analysis task.

There exist well-established machine vision techniques for acquiring and analyzing an image of a substantially two-dimensional object or a substantially two-dimensional face of a three-dimensional object. Here a camera is optimally positioned orthogonal to the plane of the object or object face under consideration to acquire an image that includes the entire object or object face. Features across the entire object or object face are then in full view in the image and are together available in the image for analysis. Even perspective image views acquired at a non-orthogonal, i.e., oblique, camera position can generally capture a complete view of a two-dimensional face or an object that is effectively two-dimensional.

For many three-dimensional parts and many manufacturing environments, this full-view image acquisition cannot be accomplished, however. Specifically, for complicated three-dimensional object shapes, and more specifically for complicated opaque objects, and for various feed material and tooling configurations, one or more object regions may obscure other object regions from the line-of-sight view of an image acquisition camera's position. As a consequence, it may not be possible from a single camera position to simultaneously view related object features such as circumferential points of a complete cross-sectional object profile. In other words, unlike that of substantially two-dimensional objects or a two-dimensional object face, related features of a complicated and opaque three-dimensional object are not guaranteed to be together fully exposed for simultaneous image acquisition. Instead, only a portion of the object and a subset of related object features are likely to be fully exposed to a single image acquisition camera angle.

The complications of this scenario are compounded in many applications where the location of a single image acquisition camera is limited by the manufacturing environment; e.g., where an optimum camera location cannot be accommodated. For example, in a scenario where an orthogonal, top-down view of a three-dimensional object may be known to encompass a complete set of object features, such vertical location of the camera may not be practical. For a large class of manufacturing applications, accommodation can be made for only a single, oblique camera location that results in a acquisition of only a perspective view of an object; and for some camera angles this can result in a large fraction of related object features being obscured in the object image.

A further complication is added for machine vision applications in which an object to be viewed is moving, e.g., rotating, during the process being monitored. In this case, a different subset of related features, e.g., a different portion of an object's cross-sectional profile or shape, is in view of the camera's line-of-sight at any given time. Traditional vision system techniques, developed typically for orthogonal image acquisition and analysis of substantially two-dimensional object surfaces, are found to be ineffective at addressing these combinations of complicated object configurations, object movement, and manufacturing constraints using only a single image acquisition camera.

SUMMARY OF THE INVENTION

The invention provides the ability to produce a complete orthogonal representation of a selected feature plane of a three-dimensional object even when only one image acquisition camera can be accommodated. This is accomplished in accordance with the invention even for image acquisition configurations in which an oblique, e.g., perspective view, of the object is captured for analysis. In accordance with the invention, a machine vision method is carried out in which a plurality of images of the object are acquired, each corresponding to a distinct orientation of the object about a selected object axis. In at least one acquired image, feature points are identified in the selected feature plane as-projected into that acquired image. Feature points are associated with an orthogonal-view representation of the selected feature plane, and feature points from at least one acquired image are correlated with physical orientations on the selected feature plane based on the object orientation corresponding to that acquired image.

With the techniques provided by the invention, an orthogonal-view representation of the selected object feature plane can be analyzed for a specified feature configuration. This can be accomplished even through only a subset of feature points may be available in any one given image of the object. Such may be the case, e.g., where portions of a complicated three-dimensional object obscure other portions of the object in a selected view of the object. A wide range of machine vision applications for inspection, monitoring, or measurement of objects, object features, object configurations, and other scenarios, are thereby enabled by the invention.

In embodiments provided by the invention, the acquired object images can be perspective-view images. In this case, feature points are identified as-projected into the perspective-view images. Feature points are here associated with an orthogonal feature plane view by mapping feature points from a two-dimensional image coordinate system that is parallel with the selected perspective view to a three-dimensional coordinate system that is aligned with the selected object axis.

In general, object images can be acquired as a sequence of images, e.g., a video sequence. A portion of each image in the sequence preferably is in common with a portion of an adjacent image in the sequence. If the object is rotating about the selected axis, then to capture images of all sides of the object, the number of images in the sequence is preferably at least a minimum number, M, of images, where M is selected as $M = T_0/T_a$, where $T_0$ is a period of revolution of the object and $T_a$ is a period required for acquiring one image.

The sequence of images can be taken from a fixed viewing location as the object rotates about the selected object axis or alternatively, an image acquisition camera can be rotated about the selected object axis, e.g., while the object remains stationary. The selected object axis can be perpendicular to the selected object feature plane, e.g., with the selected object axis operating as a vertical axis of revolution and the selected feature plane being a horizontal plane located at a position along the axis of revolution. The feature points to be identified in the feature plane can be circumferential feature points of the object.

In other embodiments provided by the invention, feature points are identified by searching for feature points in an area of the image where the feature points are expected. Here several edge detection regions can be applied at image locations corresponding to an expected location of a projection of the selected feature plane into the image. Each edge detection region is searched for an edge of a feature point, and positions of the detected edges are correlated to feature point positions. The expected location of the feature plane projection into the image can be adjusted if a feature point edge is not detected in at least a specified minimum number of edge detection regions.

In other embodiments provided by the invention, feature point of an image are correlated to orientations on the feature plane based on order position of that image in the image sequence and based on difference in object orientation between adjacent images in the sequence. In the case of a rotating object, e.g., this difference in object orientation is an angular offset between adjacent images in the sequence.

In other aspects, the invention provides a machine vision method for analyzing an orthogonal-view representation of a semiconductor melt surface from which a semiconductor crystal ingot is horizontally pulled as the ingot is rotated in a first direction about a vertical axis of rotation and the melt is rotated in a second direction about the vertical axis of rotation. Here a sequence of perspective-view images of the melt surface is acquired from a fixed viewing location, with each perspective-view image corresponding to a perspective view of a distinct angular orientation of the ingot and the melt surface about the axis of rotation. In at least one acquired perspective-view image, feature points in the melt surface are identified as-projected into that image. Identified feature points from the perspective-view image projection are mapped to an orthogonal-view projection of the melt surface, and then mapped melt feature points from at least one acquired image are correlated with physical orientations on the melt surface based on the distinct angular orientation corresponding to that acquired image and order position of that acquired image in the image sequence. Then the orthogonal-view representation of the melt surface features can be analyzed for a prespecified feature configuration.

In other aspects, the invention provides a machine vision method for analyzing an orthogonal-view representation of a selected cross-sectional circumferential contour of an object as the object rotates about an axis of rotation. A sequence of perspective-view object images is acquired from a fixed viewing location as the object rotates about the axis of rotation, with each perspective-view image corresponding to a perspective view of a distinct angular orientation of the object about the axis of object rotation. In at least one acquired perspective-view image, circumferential contour points in a feature plane corresponding to the selected cross-sectional circumferential contour and as-projected into that acquired image are identified. Circumferential contour points from the perspective-view image projection are mapped to an orthogonal-view projection of the selected circumferential contour, and circumferential contour points from at least one acquired image are correlated with physical locations around the circumferential contour based on the distinct angular object orientation corresponding to that acquired image and order position of that acquired image in the image sequence. The correlated circumferential contour points can then be analyzed based on an expected configuration of features along the contour.

In embodiments provided by the invention, the feature plane corresponding to the selected cross-sectional circumferential contour can be a plane perpendicular to the axis of object rotation. In general, the technique can further provide an indication of a degree of compliance of the circumferential contour with an expected contour feature configuration. Contour features can be detected and then, e.g., the location of the detected contour features can be analyzed based on an expectation for features location; the number of the detected contour feature can be analyzed based on an expectation for feature number; or the shape of the detected contour features can be analyzed based on an expectation for feature shape.

In another embodiment, analysis of the contour points can be carried out by first determining a center point of the circumferential contour and then determining a radius for each contour point referenced to the center point. A mean center point-to-contour point radius for the contour points is then determined, and an offset radius is produced for each contour point corresponding to a difference between that contour point's radius and the mean radius. Each radius offset is then correlated with an arc along the contour, with each arc being specified with an arc radius offset value that is an average of all radius offset values correlated with that arc. A statistical fluctuation of radius offset values is then determined for a plurality of arcs known to not include a contour feature. A radius offset threshold, based on the estimated radius offset value statistical fluctuation, is applied to detect candidate contour feature locations along the contour arcs; and a prespecified feature width threshold is then applied to the candidate contour feature locations to confirm contour features of the circumferential contour. The detected contour features are then analyzed based on an expected contour feature configuration.

The invention provides, in a related aspect, a machine vision method for analyzing an orthogonal-view representation of a cross-sectional meniscus contour produced by a semiconductor ingot on a semiconductor melt surface as the ingot is horizontally pulled out of the melt surface and the ingot and melt are rotated in opposite directions about a common vertical axis of rotation. Here a sequence of perspective-view images of the ingot and melt are acquired from a fixed viewing location, with each perspective-view image corresponding to a perspective view of a distinct angular orientation of the ingot and melt surface about the axis of rotation. In at least one acquired perspective-view image, meniscus contour points are identified as-projected into that acquired image. The identified meniscus contour points are mapped from the perspective-view image projection to an orthogonal-view projection of the meniscus contour; and then the mapped meniscus contour points are correlated from at least one acquired image with physical orientations around the meniscus based on the distinct angular orientation corresponding to that image and order position of that image in the image sequence. The correlated meniscus contour points are then analyzed to determine if a fault condition has occurred.

As in the embodiments described above, contour points, here ingot crystalline facets, can be detected around the meniscus contour and then analyzed based on facet location, number, and shape, with regard to expectations for these facet characteristics. The meniscus contour points can be analyzed to detect crystalline facets along the contour in the manner described above. This ingot facet analysis enables a robust, real time, automated machine vision monitoring of a crystal growth process to provide crystal growth process control in a manner that is more efficient and responsive than can generally be expected from monitoring by a human operator. Other features and advantages of the invention will be apparent from the claims, and from the following description and accompanying drawings.

BRIEF DESCRIPTION OF THE DRAWINGS

FIG. 7 is a flow diagram of a machine vision technique provided by the invention for monitoring a growing semiconductor crystalline ingot to determine if a dislocation has been introduced to the ingot;

FIG. 10 is a flow diagram of a machine vision technique provided by the invention for detecting facets along a semiconductor crystalline ingot-melt meniscus.

DETAILED DESCRIPTION OF THE INVENTION

Figure 1:
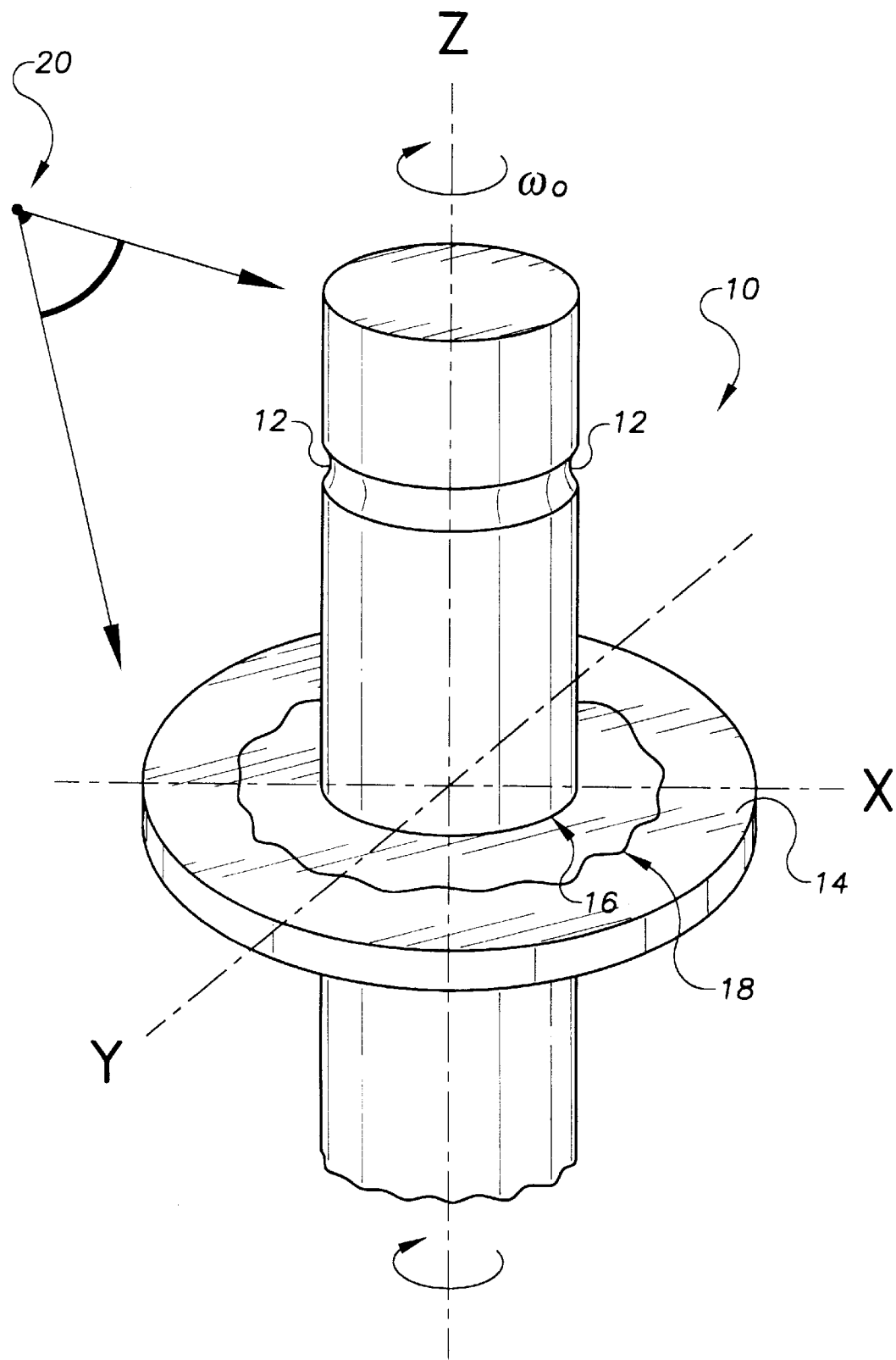
FIG. 1 is a schematic representation of an example object to be analyzed by the machine vision techniques provided by the invention.

FIG. 1 illustrates a generalized and example three-dimensional object 10 for which feature analysis is enabled by the invention. The object is described in an orthogonal physical coordinate system with an X-axis, Y-axis, and Z-axis as shown. The object can include a variety of features, e.g., profile features such as a sidewall notch 12 and the edge of an extended planar section 14; planar features such as a section junction 16 and a face feature 18, as well as other object features. The features shown in the figure are for example only and it is to be understood that a wide range of other object features and related object configurations can be included. For example, the planar section 14 may relate to an additional part or to feed material employed with the object in the application of interest. The object need not necessarily be circular; other cross-sectional object shapes can also be accommodated.

The object rotates about an axis of rotation, shown here as the Z-axis, at a known rotational speed, $\omega_0$. A viewing location 20 is specified as that location from which a perspective-view image of the rotating object is to be acquired. For any viewing location 20, various vertical surfaces of the object can be observed, and one side of planar object surfaces, i.e., surfaces orthogonal to the axis of rotation, can also be observed, with the observable side of a given planar surface defined by the vertical location of the planar surface with respect to the viewing location. The viewing location 20 is thus preferably selected such that the side of a planar surface of interest is observable. The viewing location is not limited to the particular perspective view shown and in general, can be a parallel or perpendicular view.

As the object rotates, the acquisition of images of the object, taken from the vantage point of the viewing location, results in a sequence of perspective-view images that each correspond to a portion of the object in view at the given time of that image acquisition in the sequence. Accordingly, the merging of images in such an image sequence collected during at least one complete object revolution provides an integral perspective-view representation of the object. This technique is exploited in accordance with the invention to enable the acquisition of a complete perspective view of an object, using only one image acquisition camera, and even as the object rotates.

Figure 2:
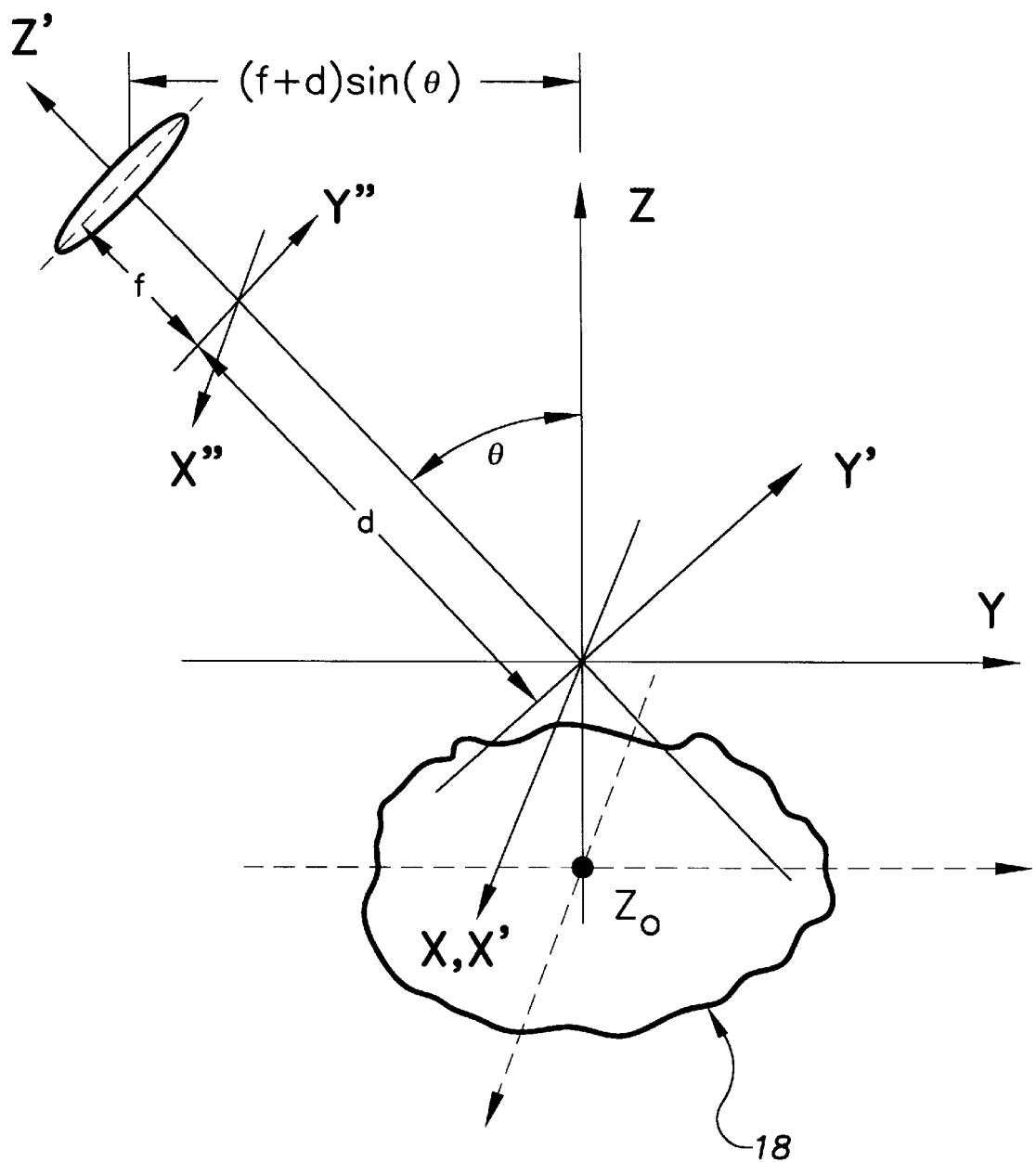
FIG. 2 is a plot of the physical, viewing, and image coordinate systems defined by the object orientation of FIG. 1.

Considering the planar feature 18 shown in the object 10 of FIG. 1, this perspective-view image acquisition process produces an image that contains a perspective-view projection of the planar feature 18 into an image plane; in general, all object features will be projected to a perspective-view by the image acquisition process. The various coordinate systems that define this projection are shown in FIG. 2 with the example planar feature 18. The physical coordinate system of the object, as shown in FIG. 1, is an orthogonal coordinate system having an X-axis, Y-axis, and Z-axis. The viewing location of the image acquisition camera corresponds to a viewing coordinate system that is also an orthogonal system, having an X'-axis, Y'-axis, and Z'-axis. This viewing coordinate system is rotated from the physical coordinate system by a viewing angle, $\theta$, which corresponds to a rotation of the viewing coordinate system about the X-axis of the physical coordinate system. In other words, the X- and X'-axes are aligned, and the Y'- and Z'-axes are rotated by the viewing angle, $\theta$, from the Y- and Z-axes, respectively.

The object image acquired by the camera is two-dimensional in nature and accordingly corresponds to a two-dimensional image coordinate system, having an X"-axis and a Y"-axis. The image coordinate system is aligned with the perspective-view orientation of the viewing location, as shown in FIG. 2, and thus is parallel with X'- and Y'- axes of the viewing coordinate system. The location of the camera at the viewing location is specified as a distance, d, of the camera position from the Z'-axis origin of the viewing coordinate system, and for a given lens configuration the focal length, f, of the camera is also specified along the Z'-axis, taken from the camera location. With these metrics, the location of the camera with respect to the physical coordinate system origin is given as a distance $(f+d)\sin(\theta)$ along the Y-axis.

The systems and techniques of the invention provide the ability to analyze object features in the object's physical coordinate system even though the features are captured in a perspective-view image of the object. The systems and techniques provided by the invention further provide the ability to analyze a complete set of related features or feature points even though only a subset of the features or feature points may be available in a given acquired object image in a sequence of acquired object images.

Figure 3:
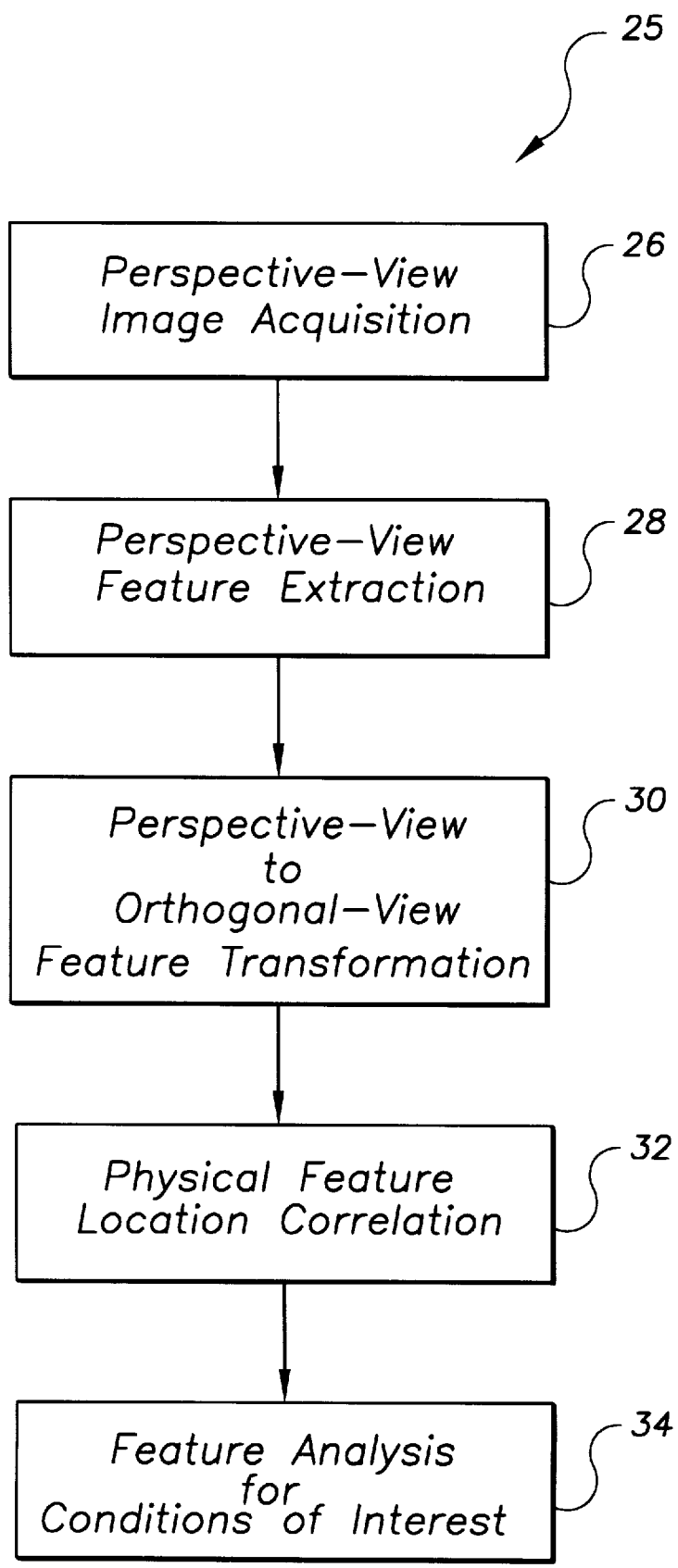
FIG. 3 is a flow diagram of a machine vision technique provided by the invention for acquiring perspective-view images of object features and analyzing the features with reference to an orthogonal view of the physical feature location on the object.

Referring to FIG. 3, these abilities are provided in a machine vision system technique 25 where in a first step 26 a sequence of perspective-view images of an object is produced while the object rotates, e.g. while the object undergoes a manufacturing process. In a next step 28 features of interest are extracted from the perspective-view image. Then a step 30 is carried out to transform the perspective-view images of the extracted features to an orthogonal view feature representation that corresponds to an orthogonal view of the features in the physical coordinate system of the object. The transformed features are then processed, based on the order of the acquired image sequence, in a step 32 that correlates each feature with the physical object location to which that feature corresponds. With this correlation complete, an orthogonal view of a full set of features of interest, mapped to the physical coordinate system of the object, is produced and available for further analysis such as a step 34 of feature analysis for a condition or conditions of interest.

Figures 1, 4:
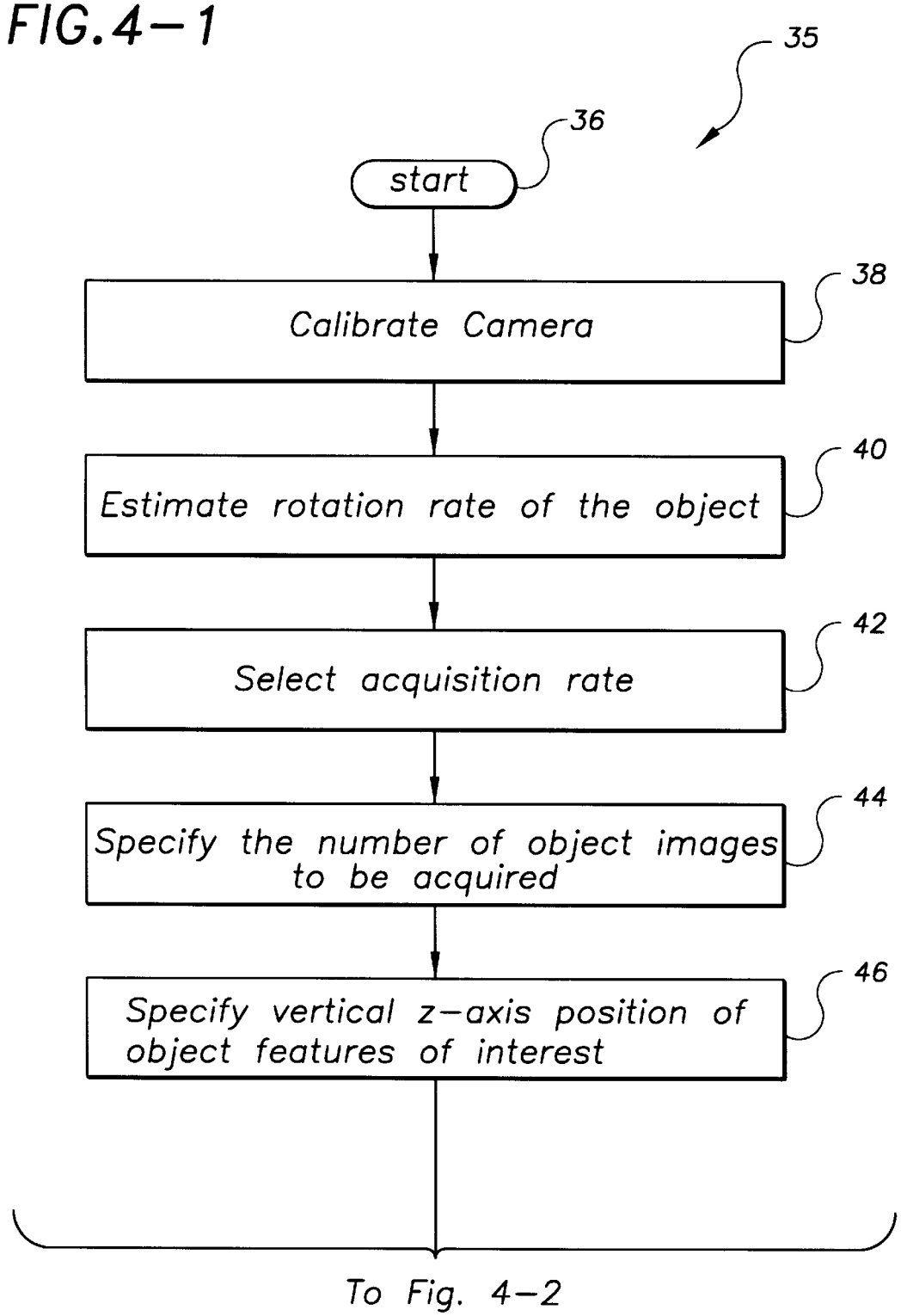
FIG. 4 is a flow diagram of a machine vision technique provided by the invention that is an adaptation of the technique of the FIG. 3 flow diagram, for acquiring perspective-view images of object features on a rotating object and at a selected plane of the object.

FIG. 4 provides a flow diagram of an example of this machine vision system technique, here adapted as a technique 35 for enabling the analysis of object features that are known to together reside in a given plane, e.g., a plane that is perpendicular to the Z-axis, of an object or system under consideration. It is common in machine vision applications for an expected location of a feature or set of features of interest to be known, and further for the features to reside together in a common plane of the object or the system under consideration. As can be recognized, the techniques of the invention can be adapted for a given feature plane of interest, and is not limited to a horizontal or vertical feature plane orientation.

At the starting step 36 of the technique, the physical coordinates of an object to be analyzed are defined and a viewing location is selected at which an image acquisition camera is positioned. Then in a calibration step 38 the camera is calibrated based on the orientation of the viewing coordinate system with respect to the object's physical coordinate system. With reference back to FIG. 2, The viewing angle, $\theta$, between the Z'-axis of the viewing coordinate system and the Z-axis of the physical coordinate system is specified, and the camera and focal length distances, d and f, respectively, are specified. The camera is then calibrated based on these metrics to set the camera's image reference coordinates. The camera is also calibrated based on the geometry of its image acquisition region. For example, a charge-coupled-device (CCD) camera is characterized by regions of pixels that capture an image; the distance between the centers of two adjacent CCD pixels must be known to enable correlation of pixel size to physical scene size.

In a next step 40 of the technique, the rotation rate, $\omega_0$, of the object under consideration is estimated. This can be accomplished in any of a number of suitable and conventional methods, e.g., using an encoder sensor, or from a priori knowledge of the parameters of the process being carried out on the object. From the object's rotation rate, $\omega_0$, then can be computed the object's period of rotation, $T_0$, where $T_0 = 1/\omega_0$. This is the time required for the object to make one complete revolution, and is the time required for an observer at the viewing location to have observed an entire perspective view of the object.

In a next step 42 the rate at which object images can be acquired by the image acquisition camera, as the object rotates, is specified. The acquisition period, $T_a$, corresponding to the specified acquisition rate, is a function of the finite amount of time required by the camera to physically produce an image of a scene; e.g., a charge-coupled-device camera requires a finite amount of photon collection time to produce an image. The acquisition period of a given camera is typically a known parameter for the camera.

At this point, a next step 44 can be completed to specify the number, M, of object images to be acquired for producing an integral object perspective view. The number, M, of specified object images corresponds to the number of images that will be available for detecting and analyzing object features of interest. Accordingly and preferably, images are acquired for at least one period of revolution of the object. The number, M, of specified object images to be acquired in an image sequence can be specified as:

$$M = n \frac{T_0}{T_a}; \quad \text{where } n \geq 1; \tag{1}$$

where n is the number of object revolutions to be included during the image acquisition sequence. When the value of n is 1, the number of acquired images, M, is that minimum number required to include images from one entire period of revolution of the object. Here it is assumed and preferred that the image acquisition process be carried out at a constant rate. It is seen that for a given period of object revolution, a relatively shorter acquisition period enables a larger number of images to be acquired during one revolution of the object. For some applications, depending on the frequency of features to be analyzed, it may accordingly be preferable to adjust the camera operation such that the acquisition time is minimized and the object image sampling frequency is increased.

In a next step 46, the vertical position, i.e., the Z-axis position, of the object plane at which the features of interest are expected or known to be located is specified. As mentioned above, for many applications, the Z-axis location of features to be analyzed is a priori specified by the application process. If the Z-axis feature plane position is not prespecified, it can be estimated using, e.g., analytical machine vision techniques for detecting feature plane position within a general expected window of positions.

A preferred technique for analytically determining a Z-axis feature plane position is described by Lowell D. Jacobson in U.S. Ser. No. 08/758,426, filed Nov. 29, 1996, and now U.S. Pat. No. 5,918,196, issued Jun. 29, 1999, entitled "Vision System For Estimating a Radius Profile of a Solid-Of-Revolution," assigned to the assignee of the present invention, and the entirety of which is hereby incorporated by reference. Briefly, in this technique, at least one perspective-view image of the object is acquired, and a feature detection process, such as an edge detection process, is then carried out on the image to locate the object features of interest and compare their locations with a hypothetical Z-axis position. The hypothetical Z-axis position value is based on an expected Z-axis position for the features of interest. If the detected features are found to define a feature plane that well-corresponds to the hypothetical Z-axis feature plane position, then numerical methods are employed to estimate the true Z-axis position of the feature plane. If the plane of the located features is found not to correspond to the hypothetical Z-axis position, then the hypothesis is iteratively adjusted until correspondence is made. This technique as described by Jacobson can be generalized to a wide range of object, material, and system features. As can be recognized, alternative techniques for estimating the Z-axis feature plane position can also be employed as-suitable for a given application.

With the Z-axis feature plane position specified, an iterative loop 48 is carried out a number, j=1 to M, times, corresponding to the number, M, of object images specified for acquisition. As explained above, this acquisition of a sequence of M images produces a sequence of M "snapshots" of the rotating object. The image sequence can be interpreted as a series of images produced by a camera as the camera is rotated about a stationary object; after each rotation of the camera by a specified interval angle, an additional "snapshot" is produced for the series. Thus, in a first step 50 of the loop 48, an image of the object is acquired.

In a next step 52 feature points of interest are detected in the just-acquired image; specifically, a set of feature points, i=1 to p, where p is the total number of feature points, is detected for a given image. A wide range of feature detection techniques are well-established and can be employed here as found suitable. Feature point detection is given here as a specific example of a more general feature point identification process contemplated by the invention. Identification of feature points is meant to refer to any machine vision process that enables distinguishing of feature points from other surrounding image areas such that an extraction of a feature point representation can be accomplished.

Generally, feature points are features of interest in the image, and are defined as image locations in the specified Z-axis feature plane that are characterized by an image intensity value that is different, in some specified manner, from the intensity values of surrounding image locations. A feature point can thus consist of an image pixel, a patch of pixels, a line of pixels, or other pixel grouping, and in general is a single pixel or a neighborhood of pixels. Features can be distinguished generally by an intensity difference, i.e., a degree of contrast, or more specifically, a defined edge. Edge detection within the image thereby provides one broadly applicable technique for feature point identification within the image.

In one popular edge detection technique, employing a Sobel operator, raw image intensity data for the entire image is converted to a corresponding edge image which identifies all edges throughout the image. A determination of which edge points in the edge image correspond to the object features of interest can then be made using, e.g., filtering techniques. This is an exhaustive edge detection technique in that it considers all possible edge points in the object image. While the technique provides a high degree of accuracy in feature detection, it requires significant computation time and thus for many applications may not be warranted.

An alternative, less computationally-intensive feature detection technique can instead be employed, preferably like the edge detection technique described by Jacobson in the patent application referenced above and incorporated herein by reference. Here a commercial edge detection tool, e.g., the machine vision system Caliper Tool from Cognex Corporation, of Natick, Mass., is applied to the image in a manner that corresponds with the Z-axis estimate for the feature plane of interest. Alternatively, a Z-axis estimate to can be produced as an integral task of the feature detection step. Briefly, using this Caliper Tool, edge detection regions are applied to hypothesized feature locations of the image expected to correspond to edges of the features to be detected. For each edge detection region there is computed the gradient of the image intensity profile along a specified search direction, and then is determined the peak in the resulting gradient profile that satisfies specified feature expectations such as feature edge direction. If the determined peak is found to satisfy a confidence threshold, then it is judged that an edge of a feature of interest has been detected. If edges are not detected for a given orientation of edge tools, then the hypothesized feature locations are iteratively adjusted until feature edges can be detected.

Once the edges of features of interest are detected, the corresponding positions of the features, referenced to the two-dimensional image coordinate system of FIG. 2, are stored for processing as a set of feature points. Specifically, a data structure is produced that indicates, for each of i=1 to p feature points located in the given image, an X"-axis coordinate and a Y"-axis coordinate in the image coordinate system.

With the image coordinates of the feature points determined, in a next step 54 the image coordinates of each feature point are transformed to the physical coordinate system of the object. Recall that the object image, being a perspective view of the object, contains perspective-view projections of the object features. In this step 54 the perspective-view feature points are deprojected from the image coordinate system to feature points in the physical coordinate system that correspond to an orthogonal view of the features in that coordinate system. This deprojection can be represented as the application of an inverse perspective transformation operator, $P^{-1}$, on the i=1 to p feature points of the $j^{th}$ image in the sequence of images, whereby $$j(x_{i-1\ to\ p}, Y_{i-1\ to\ p}, z) = P^{-1}[j(x''_{i-1\ to\ p}, Y''_{i-1\ to\ p})]. \quad (2)$$

This inverse perspective transformation operation is carried out, in effect, by first transforming the coordinates of each feature point in the image coordinate system to corresponding points in the viewing coordinate system, and then transforming those corresponding viewing coordinate system feature points to the physical coordinate system. The Z-axis location specified or detected for the feature points is then imposed. These transformations are in practice carried out in one step, based on the following considerations. Considering the image coordinate system, because the X" and Y" image plane axes are parallel to the X' and Y' viewing coordinate axes, respectively, then for the $i^{th}$ feature point, having coordinates $i(x''_i, y''_i)$, the corresponding viewing coordinates, $i(x'_i, y'_i)$ are given as:

$$x'_i = \frac{x''_i \cdot \Delta_i}{f \cdot k}; \quad (3)$$

$$y'_i = \frac{y''_i \cdot \Delta_i}{f \cdot k}; \quad (4)$$

where f is the camera focal length, as described above; k is the camera-specific calibration value described above that specifies, in m/pixel, the distance between the centers of two adjacent pixels of the image acquisition camera; and $\Delta_i$ is given as $\Delta_i = f+d-z'_i$. Here d is the distance of the camera from the Z'-axis origin and $z'_i$ is the projection of the physical coordinate system Z-axis feature plane position, $z_i$, for the $i^{th}$ feature point, to the viewing coordinate system.

Considering the physical coordinate system, the transformation of the $i^{th}$ feature point in the physical coordinate system, $i(x_i, y_i, z_i)$ to the viewer coordinate system as $i(x'_i, y'_i, z'_i)$ is produced as:

$$\begin{vmatrix} x'_i \\ y'_i \\ z'_i \end{vmatrix} = \begin{vmatrix} 1 & 0 & 0 \\ 0 & \cos\theta & \sin\theta \\ 0 & -\sin\theta & \cos\theta \end{vmatrix} \begin{vmatrix} x_i \\ y_i \\ z_i \end{vmatrix}; \quad (5)$$

where θ is given with reference to FIG. 2 as the angle between the physical coordinate system X-axis and the viewing coordinate system X'-axis. The matrix operation indicated by this expression can be carried out to produce the following representations for the transformation:

$$x'_i = x_i, \quad (6)$$

$$y'_i = y_i \cdot \cos\theta + z_i \cdot \sin\theta; \quad \text{and} \quad (7)$$

$$z'_i = -y_i \cdot \sin\theta + z_i \cdot \cos\theta. \quad (8)$$

Then substituting expression (8) in expressions (3) and (6) with regard to the X-axis, and substituting expression (8) in expressions (4) and (7) with regard to the Y-axis, the analytical relations to be carried out for the inverse perspective transformation operator, $P^{-1}$, defined above, are given as:

$$y_i = \frac{y''_i(f+d) - z_i(y'' \cdot \cos\theta + f \cdot k \sin\theta)}{f \cdot k \cos\theta - y''_i \sin\theta}; \quad (9)$$

$$x_i = \frac{x''_i(f+d - y_i \cdot \sin\theta - z_i \cdot \cos\theta)}{f \cdot k}. \quad (10)$$

These expressions (9) and (10) are implemented for each of the feature points, i=1 to p in the $j^{th}$ image, to transform the set of image coordinate system feature points, $j(x''_{i=1 \text{ to } p}, y''_{i=1 \text{ to } p})$ to physical coordinate system feature points, $j(x_{i=1 \text{ to } p}, y_{i=1 \text{ to } p}, z)$ at the Z-axis feature plane position specified or estimated in the previous step 46 for the features of interest. The physical coordinate system feature points represent an orthogonal view of the features in the Z-axis feature plane.

As can be recognized, the coordinate system transformation steps just described can be adapted for various optical conditions of a given application. For example, in an application where the index of refraction is known to change along the line of sight from the image acquisition camera to an object feature plane of interest, then Snell's law relating refractive index with angle of ray direction can be imposed, in the conventional manner, on the transformation expressions at the locations of index changes. With this adaptation, the transformation expressions then will account for diffraction conditions of the application.

In the next step 56 the transformed feature points are each correlated with the physical location of the object Z-axis feature plane to which that point corresponds. Recall that, as explained above, a sequence of M object images represents a series of "snap shots" of the object taken at different angles as if the object were motionless and the camera were moved around the object. Each object image therefore corresponds to a particular object angle that depends on that image's position in the image sequence. But the feature points in each image, as-acquired, are aligned at one and the same object angle with the feature points of all the other images, without regard for the specific object angle that corresponds to a given image in the sequence. The correlation step 56 associates each set of image feature points with the correct object angle for those points, and manipulates the points in a corresponding manner such that the points are correctly oriented with respect to their physical location on the object.

In general, where the object is randomly shaped and the axis of object rotation is randomly located, this correlation operation can be carried out using a conventional pattern matching technique in which features of sequential images are compared to correspondingly align the features. The complexity of such a pattern matching technique can be reduced if adjacent images include an overlap of a given object view. Depending on the object image sampling frequency, the rate of object rotation, and other factors, adjacent object images in the image sequence can include redundant object information; in other words, portions of a common view of the object may appear in more than one object image. If the feature location correlation is to be carried out by a pattern matching technique, then it is preferred that some object view overlap be produced. Note also that if there is object overlap between each adjacent object image in the image sequence, then it is assured that an integral image of the entire surface of the object is acquired in one revolution of the object.

For many cases, however, in which the object shape is known, the object's axis of rotation is symmetrical and known, and the features of interest are generally known, the feature correlation can be carried out as a rotation transformation. Here the set of feature points for the $j^{th}$ object image is rotated by an offset angle referenced to the object orientation for the first image in the image sequence, whereby the correct object angle corresponding to the given set of feature points for the $j^{th}$ object image is imposed. The angular change in image orientation between each of the images in the image sequence is based on the object's period of rotation, $T_0$, and the acquisition period, $T_a$, as $2\pi \cdot T_a/T_0$. Thus, for the $j^{th}$ image, the offset angle, $\lambda_j$, of that image from the initial image orientation reference is given as:

$$\lambda_j = 2\pi \cdot j \cdot T_a/T_0; \quad (11)$$

where j is the index number of the image in the sequence of images. The imposition of this angular offset orientation to the $j^{th}$ image feature point set correlates the feature set with its true physical orientation on the object.

In one example technique for imposing an angular offset on a feature set, each feature point is first translated from its given coordinates in the physical coordinate system to the origin of the physical coordinate system; is rotated by the specified offset angle; and is then translated back to its given coordinates. This three-step operation can be represented as producing an angular offset feature point,$j_{ao}(x_i, y_i)$ by imposition of a forward translation operator, T, a rotation operator, R, and a reverse translation operator, $T^{-1}$, as follows:

$$j_{ao}(x_i, y_i) = T^{-1} RT[j(x_i, y_i), \lambda_j]. \quad (12)$$

The forward translation of a feature point to the origin of the physical coordinate system is produced by imposing on a given feature point the translation operator, T, given as:

$$T = \begin{vmatrix} 1 & 0 & x_i \\ 0 & 1 & y_i \\ 0 & 0 & 0 \end{vmatrix}. \quad (13)$$

The rotation of the translated feature point by the designated offset angle is produced by imposing on the translated feature point the rotation operator, R, given as:

$$\mathcal{R} = \begin{vmatrix} \cos \lambda_j & \sin \lambda_j \\ -\sin \lambda_j & \cos \lambda_j \end{vmatrix}. \quad (14)$$

Finally, a reverse translation of the feature point, after its angular offset, is produced by imposing the reverse translation operator, $T^{-1}$, given as:

$$T^{-1} = \begin{vmatrix} 1 & 0 & -x_i \\ 0 & 1 & -y_i \\ 0 & 0 & 0 \end{vmatrix}. \quad (15)$$

All of the feature points of the $j^{th}$ object image are processed based on the translation and rotation operators, whereby the entire feature point set for the image is adjusted to correctly represent its true physical location and orientation on the object.

With this correlation complete, an orthogonal view of the features in the image, oriented to the proper object angle, is produced. A next image can then be acquired in the sequence of images to be produced. Referring back to the flow diagram of FIG. 4, in a next step 58 it is determined if a complete sequence of M images has been acquired and analyzed. A conventional counter and comparison technique can be employed to make this determination. If the number, M, of images has been acquired and analyzed, then the processes moves to an end step 60. If less than the number, M, of images has been acquired and analyzed, then the loop 48 is continued to acquire and analyze the next $j^{th}$ image in the sequence.

Once all M images are acquired and analyzed, a complete orthogonal view of the object features of interest at the specified Z-axis plane of the object is available for further processing. This further processing, referring back to FIG. 3, can consist of feature analysis for conditions of interest, or other such feature processing. Specific examples of feature processing techniques are described below.

As can be recognized, the order of the acquisition and feature processing steps in the machine vision technique 35 of FIG. 4 can be adjusted without loss of functionality. Preferably, the technique is adapted based on a desired image analysis speed required for a given application. For example, if real time image acquisition and feature analysis is required, then the most computationally-efficient implementation is preferably employed. Computational efficiency is enhanced by maximizing the amount of image analysis applied to a given image rather than to a sequence of images. For example, the implementation of FIG. 4, in which each image in the sequence is processed individually in turn, is more computationally efficient than a process in which all M images are acquired prior to detection and analysis of features in the images. In contrast, if an object under investigation is rotating at a high speed, then an entire image sequence may be acquired prior to detection of features in the images. If off line, rather than real time, feature detection and processing is to be carried out, then computational efficiency is not critical, and processing can be accomplished in a convenient manner.

Other adaptations can also be imposed on the machine vision technique of FIG. 4 and its more general version of FIG. 3. For example, the object image view selected for the image acquisition camera can be any selected view, including an orthogonal or a parallel view, and is not limited to an oblique view of any particular viewing angle. The transformation operations described above are an example of a more general association operation contemplated by the invention that associates the feature points of a given image acquisition view with an orthogonal view of the selected feature plane. If the image acquisition view is an orthogonal view of the selected feature plane, then the association task is a simple one-to-one correspondence operation. If the image acquisition view is some non-orthogonal, e.g., perspective view, then the transformation process implements a mapping of the feature points in the perspective view image representation to the desired orthogonal-view feature plane representation.

To acquire images of all sides of the object, the object can rotate about a selected axis of rotation, as described above, or alternatively, the object can be maintained in a stationary position and the camera can be moved around the object. If an entire feature set analysis is not required or if an entire feature set can be viewed with a number of images smaller than that corresponding to a full object rotation, then the object can be rotated only partially through one revolution, or the camera can be moved around only the object sides of interest. In this case, a subset of images, e.g., as little as one or two images, can be employed for feature detection and analysis.

If multiple feature planes are of interest, the object can be analyzed multiple times, each time with a different selected object axis around which the object rotates or around which the camera is moved. The feature plane of interest and the selected object axis can in each case be of a differing orientation, and in general the feature plane of interest does not need to be oriented perpendicular to the axis of rotation. More generally, the feature plane of interest can exhibit slant and tilt with respect to the viewing location as the object rotates, due, e.g., to an oblique orientation of the feature plane with respect to the axis of rotation. In this case, in one example scenario, for each image in the image sequence, a coordinate transformation is imposed on the feature plane based on the degree of slant and tilt and the point of the feature plane that is intersected by the line of sight of the camera. Such a transformation of the feature plane then enables the above feature processing steps to be carried out. A feature plane transformation that accounts for slant and tilt of the plane with respect to a viewing location is provided by Lowell Jacobson in "Conjoint Image Representation and its Application to Viewpoint Invariant Form Recognition and Optical Flow Estimation," University of Minnesota, Ph.D. thesis, 1987.

As can be recognized, other adaptations of the technique are contemplated by the invention. For example, the feature point transformation steps described above can be imposed on an entire image coordinate system instead of on particular feature points themselves. In one example of this scenario, the image coordinates are transformed to corresponding physical coordinates prior to detection of features in the image. Then, when features points are detected in the image, the locations identified in the image as being associated with detected feature points are automatically referenced to the physical coordinate system, and a separate feature point transformation step is not required. In a further adaptation, correlation of the transformed image coordinates to their corresponding physical orientations on the feature plane can be carried out prior to the step of identifying feature points in the images. Here each image can be transformed and correlated for carrying out feature point identification in each image, or alternatively, the transformed images can be averaged in the transformation process to produce an average transformed image in which feature points are identified. In a further alternative technique, one acquired image can be transformed to the physical coordinate system, correlated to its physical orientation on the feature plane, and then transformed back to the image coordinate system. Then the other acquired images can be correlated in the image coordinate representation, rather than the physical coordinate representation, to their physical orientations, based on the image representation of the first transformed and correlated image. Correlation can thus be accomplished in any desired coordinate system representation with the appropriate correspondence to the physical coordinate system provided in some manner. Other such adaptations can be accommodated.

Figure 5:
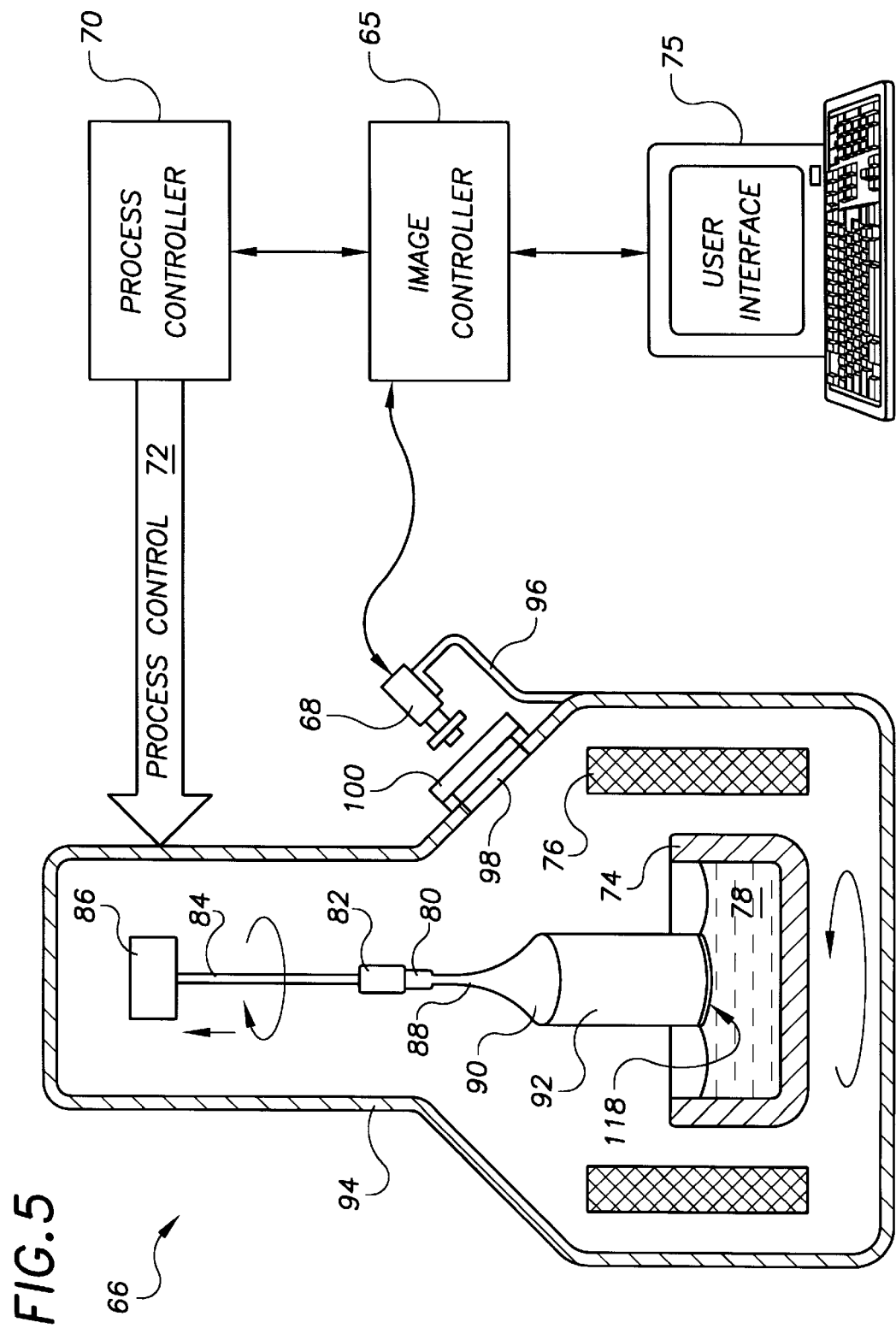
FIG. 5 is a schematic representation of a semiconductor crystal ingot growth apparatus and of a machine vision image processor provided by the invention for monitoring the apparatus using the machine vision techniques provided by the invention.

Referring to FIG. 5, there is shown an example implementation of a machine vision image processor 65 configured in accordance with the invention for a machine vision application requiring acquisition of multiple object images, produced by only one camera, to analyze a set of object features. The example application here is the monitoring and control of a semiconductor crystal growth apparatus 66 and its operation. The image processor 65 processes images acquired from an image acquisition camera 68 and based on the image processing, directs a process controller 70 to signal process control 72 to the crystal growth apparatus. A user interface 74 is provided for input of image process parameters and for output of the image processing results to the user.

Virtually all electronics-grade single crystal semiconductor wafer production, e.g., silicon and gallium arsenide wafer production, is accomplished using an apparatus like that shown in FIG. 5, for carrying out the well-known Czochrolaski crystal growth technique. In the Czochrolaski crystal growth technique, for, e.g., growth of a silicon ingot, a crucible 74 of electronic-grade silicon pieces is heated using, e.g., an annular radiant heating mechanism 76, to produce a silicon melt 78. A single crystal seed crystal 80, mounted in a crystal chuck 82, is dipped into the melt and then slowly pulled upward as both the crystal and the crucible are rotated, in opposite directions, to enable the condensation of the melt onto the seed crystal in the crystalline structure of the seed crystal. A cable 84 supported from a cable controller 86 draws the growing crystal upward and rotates the crystal. A crucible controller (not shown) rotates the crucible in a direction opposite that of the crystal. As the crystal growth progresses, a neck 88, crown 90, and body 92 of a silicon ingot, or boule, is produced. Once a complete ingot has been grown, the ingot is then sliced into wafers for further processing, e.g., monolithic circuit fabrication.

The silicon ingot growth process is expensive and sensitive to process error, and thus requires constant monitoring to ensure satisfactory process progression. Because the process typically must be carried out under vacuum or in an inert atmosphere to suppress impurity absorption into the silicon, and due to the high temperature of the silicon melt 78, the apparatus is typically housed in a secure housing such as a steel-walled chamber 94. As a result, a process operator does not have direct access to the process and cannot use tactile monitoring techniques.

In accordance with the invention, an acquisition camera 68 is secured by, e.g., a bracket 96 such that the camera is oriented over an optical view port 98 of the chamber 94. Typically only a single such view port 98 is provided as the single optical access point to the silicon growth process, and generally includes a heat shield 100 for protecting the observer from the high temperature internal to the chamber. Note that due to the configuration of the growth crucible and annular heater, the melt, and the vertical ingot pulling apparatus, the view port can generally only be located, as a practical matter, at a point along the chamber that provides a perspective view of growing ingot and the melt. A side or top-down view of the process is not possible. The perspective-view image acquisition and analysis techniques provided by the invention enable a robust, automated, and real time machine vision monitoring of the crystal growth process while accommodating the oblique process view provided by the single chamber view port. The machine vision monitoring process is found to provide process control in a manner that is more efficient and responsive than could be expected from human operator monitoring.

Figure 6:
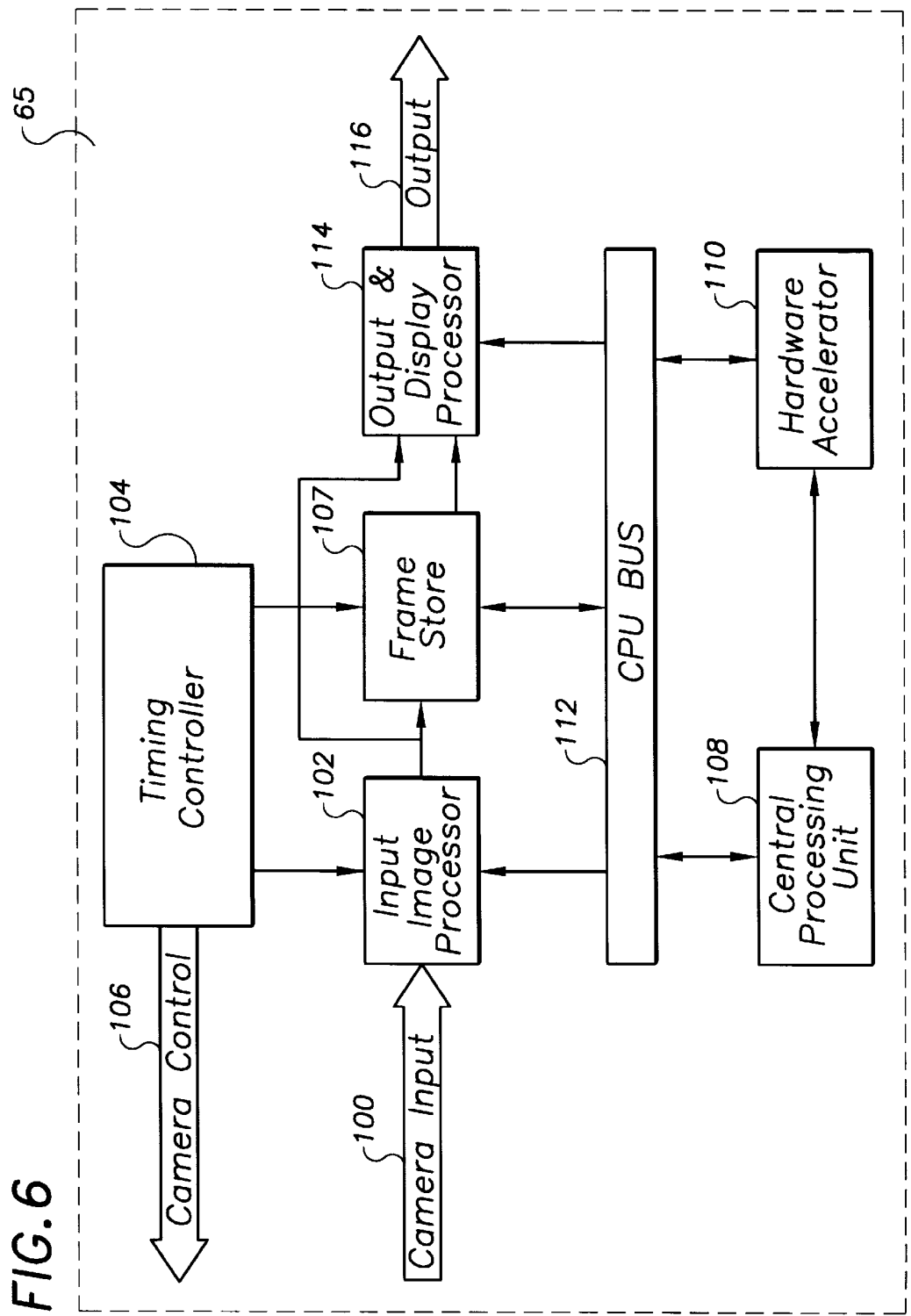
FIG. 6 is a block diagram of the components of the image processor of FIG. 5 as provided by the invention.

Referring also to FIG. 6, there is shown an example configuration of the image processor 65 provided by the invention for carrying out the image acquisition and analysis technique of FIG. 3 for, e.g., monitoring the silicon growth process of FIG. 5. Input 100 from the image acquisition camera is directed to an input image processor 102. A timing controller 104 directs the operational timing of input image processor 102 and provides timing camera control 106 to synchronize the image acquisition operations of the camera with the processor operations. Preferably the camera is implemented as a general purpose video camera such as the XC75 CCD camera available from Sony Corp.

The input image processor accepts the camera input in the form of analog signals, conditions the signals, e.g., by applying gain and offset levels, to compensate for particular process conditions, and then digitizes the signals. The resulting digitized signals are pixel intensity value representations that are formatted as rows of pixels in image frames. As the pixel intensity data is produced it is stored in a frame store 106 for access by a central processing unit (CPU) 108 and optional hardware accelerator 110 to carry out the image and feature analysis. User input, e.g., expected vertical location of the ingot-melt meniscus, from the user interface, is input to the CPU for control of the image analysis. A CPU bus 112 provides both data and control signal communication between the various processing modules, as shown. If the CPU is not implemented as a relatively high-speed processor, e.g., as a Pentium™ processor from Intel, Corp., then a customized hardware accelerator 110 is preferably included to enable a speed of image analysis that accommodates real time process monitoring and control. If real time process monitoring and control is not required, then a relatively slower processor can be accommodated.

Once the image and feature analysis is complete, the resulting image data is directed from the CPU 108 and optional hardware accelerator 110, via the CPU bus 112, back to the frame store 106. This processed image data, as well as input image data from the input image processor 102, is directed to the output and display processor 114. The output and display processor 114 creates an analog video signal corresponding to the digital image data, and produces an output 116, e.g., a display drive output, for displaying the analog video signal on a user interface monitor. The analog signal can be created based on real time input image data, frame store image data, or various combinations of real time and stored image data, depending on the analysis being carried out and the requests of the user. The timing controller synchronizes the camera input 100 with the processing operations and the processor output 116 to maintain a known regulated time sequence of image data.

One suitable commercial image processor that can be configured to carry out the image acquisition and analysis techniques of the invention is the 4400 Vision Processor Board and accompanying software from the Cognex 4000 Series Vision System available from Cognex Corp., of Natick, Mass.

Referring back to FIG. 5, the user interface can be provided as a conventional computer, including, e.g., a screen and keyboard, or can be configured as a memory storage unit, printer unit, or other communication mechanism. The user interface can be remote from the processor, connected by, e.g., a shared-bus, a local area network, a wide area network, a wireless network, or other communication scenario. Similarly, the image processor can be located remotely from the image acquisition camera, with communication between the two effected by wire or wireless network, for example.

As can be recognized, the image processor can be configured in various scenarios based on the application environment. For example, given multiplexing/demultiplexing capabilities, the processor can be configured to monitor several crystal growth processes simultaneously. The processor can be implemented using commercially-available hardware such as that described above, or can be implemented entirely in customized hardware, alternatively implemented on a general purpose computer system with corresponding software, or alternatively implemented on a suitable combination of hardware and software components that accommodates demands of a given application.

Referring back to FIG. 5, the image processor and image analysis techniques provided by the invention find many specific applications in the crystal growth example presented. Real time and automatic monitoring of the apparatus enables the detection of growth conditions that could indicate a fault in the process conditions or a defect incorporated in the crystal ingot. An important example of such monitoring is the inspecting of the ingot for the appearance of edge dislocations in the crystal. Briefly, a crystal lattice edge dislocation is a point along the crystalline structure at which an extraneous plane of atoms is inserted. If the condensation conditions of the silicon melt on the growing seed crystal are suddenly rendered irregular, due to, e.g., a sudden change in the melt solidification temperature, then an extra plane of atoms can be produced on the ingot, resulting in a dislocation of the crystalline lattice.

Because dislocations can act as a sink for metal impurities and can alter dopant diffusion profiles during electronics fabrication, it is highly desirable to ensure that the growing ingot is free of dislocations. Specifically, it is desirable to monitor the ingot at the ingot-melt interface, called the ingot-melt meniscus, to determine if a dislocation has just been produced. The early and fast detection of a dislocation at the point of dislocation formation, i.e., the meniscus, enables the halting of the crystal growth process before significant additional crystal growth has occurred beyond the point of a dislocation introduction.

As a practical matter, the appearance of a dislocation in the crystal ingot can be indicated by a change in the cross-sectional profile of the ingot. This is a result of the fact that the particular selected crystallographic orientation of a semiconductor crystal being grown imposes a characteristic cross-sectional profile on the growing ingot. For example, a dislocation-free ingot of <100>-oriented single crystal silicon exhibits four longitudinal crystalline ingot facets on the ingot, each facet equally spaced from the others around the 360° ingot circumference and each facet exhibiting symmetry with that facet which is 180° around the circumference.

When a dislocation is introduced into the <100>-oriented ingot, this characteristic facet profile is in general lost. For example, the 180° facet symmetry may be lost, the regular spacing of the facets around the ingot circumference may be lost, or the presence of one or more of the facets may even be lost. Thus, monitoring of the ingot for a loss in the expected crystalline facet number, location, and symmetry can be carried out to ascertain when a dislocation has been introduced to the ingot.

In accordance with the invention, a perspective view of the ingot-melt meniscus is monitored for the expected cross-sectional meniscus profile to determine in real time if a dislocation has been introduced to the ingot. The image acquisition and feature analysis techniques of FIG. 3 are in this example adapted to produce, from a perspective view of the rotating ingot, a meniscus view that is orthogonal to the ingot cross-section and that is located at the ingot-melt meniscus plane.

Referring back to FIG. 5, the ingot-melt meniscus 118 in a typical crystal growing process is visible as a bright region that extends at the surface of the melt 78 to contact the underside of the growing ingot. The meniscus arises from surface tension of the melt on the ingot and appears as a distinguishably bright region because its curved surface strongly reflects light emitted by the hot wall of the crucible. At the initial stages of the crystal growth process, as the neck and crown of the ingot are formed, a pronounced meniscus may not yet be visible, but the boundary between the ingot and the melt is here still generally visible as an abrupt change in boundary luminance.

Referring to FIG. 7, in a <100>-oriented silicon ingot dislocation monitoring technique 125 in accordance with the invention, the process start step 130 is initiated as a crystal growth process to be monitored is carried out. Then in a first step 132, an orthogonal representation of the ingot-melt boundary, i.e., the meniscus cross-sectional contour, is produced. This step is carried out by implementing, e.g., the technique of FIG. 3 for acquiring a sequence of perspective-view images and detecting and analyzing features in the images to produce a complete orthogonal representation of the meniscus contour. With the contour produced, in a next step 134 there is determined the center point of the meniscus cross-sectional contour, and in a corresponding next step 136, there is determined the radius of each meniscus contour point from the meniscus center point.

Following this determination, a step 138 is carried out to detect facet features along the meniscus cross-sectional contour. With the facet features detected, in a next step 140 it is determined if four facets are included in the contour. If the number of detected facets is not four, a report step 142 is then indicated to report the appearance of a dislocation in the growing <100>-oriented silicon ingot. If the number of detected facets is four, then a next step 146 is carried out to determine if the four facets are spaced equally around the circumference of the meniscus contour. If the spacing is found to not be adequate, i.e., not equal, then the reporting step 142 is carried out to indicate the appearance of a dislocation in the growing ingot. If the facet spacing is found to be adequate, then the facet shape symmetry is investigated in a symmetry analysis step 148. Here it is determined if each facet is shaped like the facet spaced 180° around the meniscus contour. If it is found that 180° facet shape symmetry does not exist, then the reporting step 142 is carried out to indicate the appearance of a dislocation in the growing ingot. If correct facet shape symmetry is found to exist, then a confirmational reporting step 152 is carried out to report no appearance of dislocations.

Considering these steps in more detail, with regard to the step 132 of producing an orthogonal representation of a meniscus cross-sectional contour, as the sequence of M images is collected the image features are processed in accordance with the technique of FIG. 3 to detect the meniscus contour points in the images. This is accomplished in one example technique provided by the invention by examining locations of the images at which meniscus contour points are expected to be positioned. An edge detection tool such as the Cognex Corp. Caliper Tool referenced above can be employed to impose a set of edge detection regions on the images at the expected meniscus point locations.

Figure 8A:
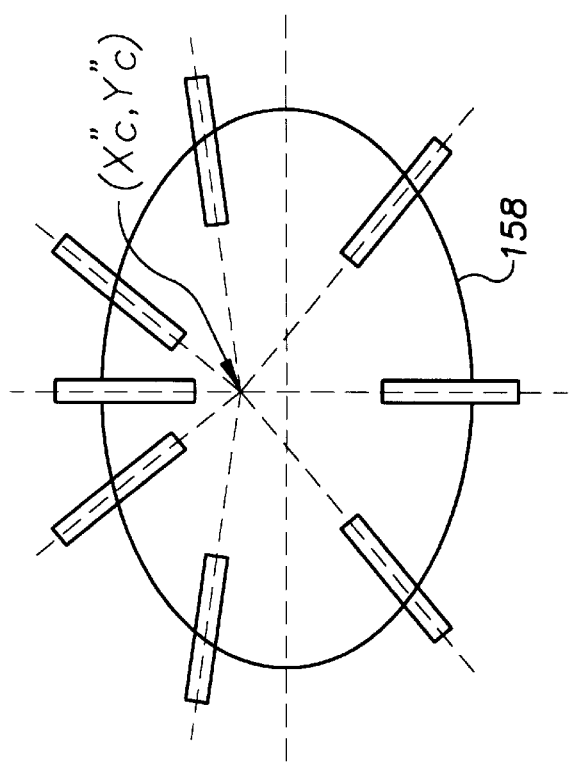
FIG. 8A is a schematic representation of an orthogonal view of a circular meniscus contour produced by the machine vision technique of the flow diagram of FIG. 7.
Figure 8B:
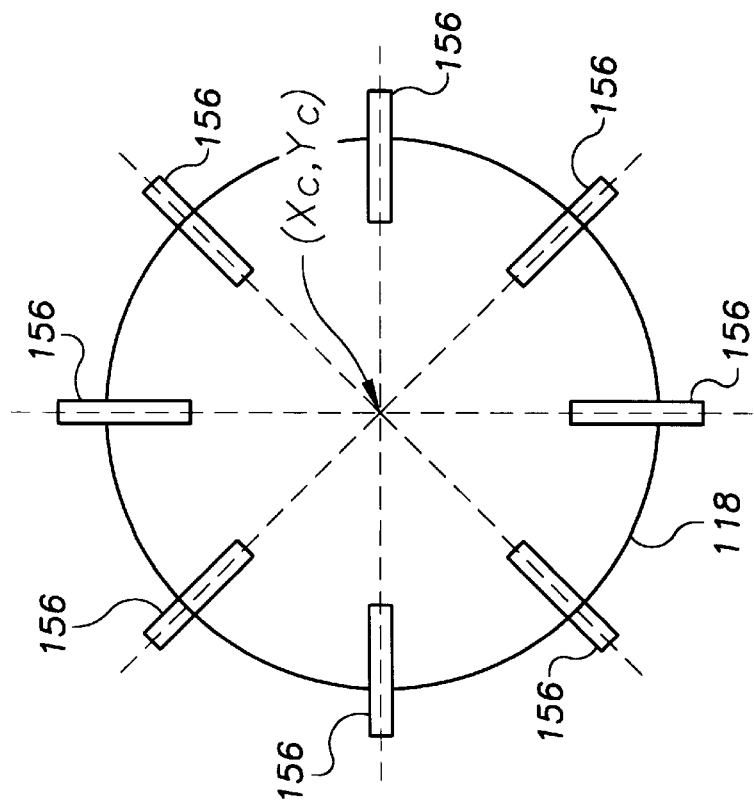
FIG. 8B is a schematic representation of a perspective-view elliptical projection of the circular contour of FIG. 8A into a perspective-view image.

Referring to FIGS. 8A and 8B, the positioning of the edge detection regions in the images is based on the expected shape and location of the a perspective-view projection of the meniscus into the images. An orthogonal, top-down, cross-sectional view of the physical meniscus 118 is generally circular in shape, as shown in FIG. 8A. A theoretical positioning of a set of edge detection regions 156 around this physical meniscus representation would preferably locate the regions at a regular angular interval around the contour 118. Then in the step of correlating detected contour points with physical meniscus locations, a single common offset angle could be applied to each image's contour points.

A projection of the circular meniscus into a perspective-view image is an elliptical contour 158, as shown in FIG. 8B. The circle is here stretched to an ellipse and the center point of the meniscus circle ($x_c$, $y_c$) in the physical coordinate system is shifted in the elliptical projection to an ellipse center point ($x_c''$, $y_c''$) in the image coordinate system that is shifted away from the origin. Correspondingly, the perspective-view projection of a regular spacing of edge detection regions 156 along the circular contour is a set of image edge detection regions 160 that are irregularly spaced around the elliptical contour 158.

In accordance with the invention, the center point, ($x_c''$, $y_c''$) and major and minor axes, a and b, respectively, of the elliptical meniscus projection 158 is hypothesized to determine image locations at which the meniscus projection is likely to appear. The projection of the Z-axis meniscus position into the two-dimensional image plane is also hypothesized. The image edge detection regions 160 are then applied at the corresponding image location at which the elliptical contour is expected, as shown in FIG. 8B, and at positions computed to correspond to a regular spacing of the regions in an orthogonal view of the circular meniscus as shown in FIG. 8A.

Various techniques can be employed for generating the parameter values for a hypothetical ellipse. For example, conventional blob analysis can be employed with regard to images of the crystal growing apparatus to detect bright regions in the image and to determine the center of gravity, width, and height of each such region. Alternatively, ellipse hypotheses can be generated randomly over a bounded three-dimensional parameter space that reflects the expected range of positions and sizes of the elliptical meniscus; as can be recognized, other hypothesis generating techniques can be employed.

With the parameter values for the hypothesized meniscus ellipse determined, the locations of the image edge detection regions to be imposed at the expected ellipse image positions are determined. The X-axis and Y-axis coordinates for a uniform edge detection region spacing are transformed to X''-axis and Y''-axis coordinates for the image coordinate system. This can be accomplished using expressions (3)–(8) given above, here solving the equations for image coordinate system values instead of physical coordinate system values. In order to most accurately detect meniscus points along the predicted elliptical meniscus image projection, it is preferred that each edge detection window be aligned along a ray emanating from the predicted center point of the ellipse, as shown in FIG. 8B. This alignment maximizes the accuracy of the detected ellipse points and increases the speed at which edges can be detected. The orientation of each edge detection region to impose this alignment is determined based on the hypothesized ellipse center point and the computed ellipse contour location at which that region is to be located. For a specified location and alignment of an edge detection region, the imposed location and alignment is adjusted, if necessary, to ensure that the entire region will be located within the boundary of the image.

This image edge detection region positioning and alignment enables spacing of the regions around the hypothesized ellipse at intervals which will result in a uniform angular offset between the detected meniscus contour points once the detected points are transformed to the physical coordinate system. While this technique is in many cases preferable for the simplicity it enables in the feature orientation step, as can be recognized other edge detection region spacing can be employed, e.g., with a uniform spacing of regions in the image coordinate system rather than the physical coordinate system.

Depending on the expected frequency of variation in meniscus profile, a suitable number of image edge detection regions is selected. Each edge detection region is preferably configured of a length sufficient to capture an edge given an expected amount of noise or error in the image in the expected meniscus region. Given that each region is aligned with a ray emanating from the ellipse center point, it is preferred that the edge detection regions be relatively narrow and elongated. Each edge detection region is configured to impose an edge search direction aligned with the ray along which that region is imposed. As is conventional, for each edge detection region the gradient of the image intensity profile is computed along the specified search direction, and then the peak in the resulting gradient profile that satisfies specified edge characteristics, such as minimum contrast, is determined. If the found peak in any given edge detection region exceeds a configurable threshold, then it is judged that an edge has been detected in that region and the position of the edge in the image is recorded.

Preferably, the edge detection tool seeks the strongest edge point along the full extent of each edge detection region such that a set of elliptical meniscus points can be detected even when the hypothesized ellipse 158 has a slightly different position and size than the actual elliptical meniscus in the image. A confidence factor in the edge detection can be imposed by requiring that an edge be detected in some minimum number of the edge detection regions. For example, it can be required that if an edge point is identified in fewer than three edge detection regions, then the ellipse hypothesis is adjusted and the edge detection is again carried out. The ellipse hypothesis can accordingly be iteratively adjusted until a prespecified minimum number of meniscus points are detected in edge regions.

As can be recognized, the number of elliptical meniscus contour points detected determines the precision with which the physical contour can be reconstructed. It is thus preferable that as many meniscus points be detected as possible. In one example scenario, at least one meniscus point is detected for each angular degree around the 360° meniscus circumference. This can be accomplished using an appropriate number of edge detection regions to be imposed on each acquired image, or alternatively, using fewer edge detection regions in a correspondingly larger number of acquired images; in other words, a tradeoff between number of edge detection regions and number of acquired images can be made to obtain a desired number of detected points. During various phases of an operation being monitored, e.g., during various phases of crystal ingot growth, only portions of the meniscus may be visible. Depending on the expected visibility of the meniscus, a subset of the edge detection regions can be "turned off" to maximize computational efficiency at a given time of feature analysis.

Each image in the sequence of acquired images is processed by imposing the above-described elliptical edge detection operation on that image. As explained previously, each acquired image can be processed in turn or all alternatively all M images can be processed together once acquired, depending on the computational efficiency required for a given application. Once the ellipse edge points are determined for a given image, the image coordinates can be transformed to the physical coordinate system in the manner described above to produce the desired orthogonal physical meniscus representation. With all images in the image sequence processed, this representation is a set of physical meniscus points, $S(x_i, y_i)$, where i=1 to n, and n is the total number of meniscus points produced from all the images in the sequence of acquired images.

Referring back to FIG. 7, in the step 134 for determining the center point of the meniscus cross-sectional contour, the detected elliptical meniscus image points are employed to find an equation that represents the detected meniscus ellipse and that therefore identifies the center point of the meniscus. This step can thus be carried out prior to the transformation of the elliptical meniscus image to the orthogonal physical representation. In one example ellipse equation fitting process, the major axis, a, minor axis, b, and center point, $(x''_c, y''_c)$ of the meniscus ellipse is determined for the set of detected ellipse points by finding the values of these three parameters that minimize the mean-squared error between the equation for an ellipse having these parameter values and the detected meniscus edge points. Appendix A presents an example procedure for fitting an ellipse to a set of detected edge points. The Appendix A also presents an expression for determining the physical Z-axis location of the meniscus contour based on the ellipse parameters.

Figure 9:
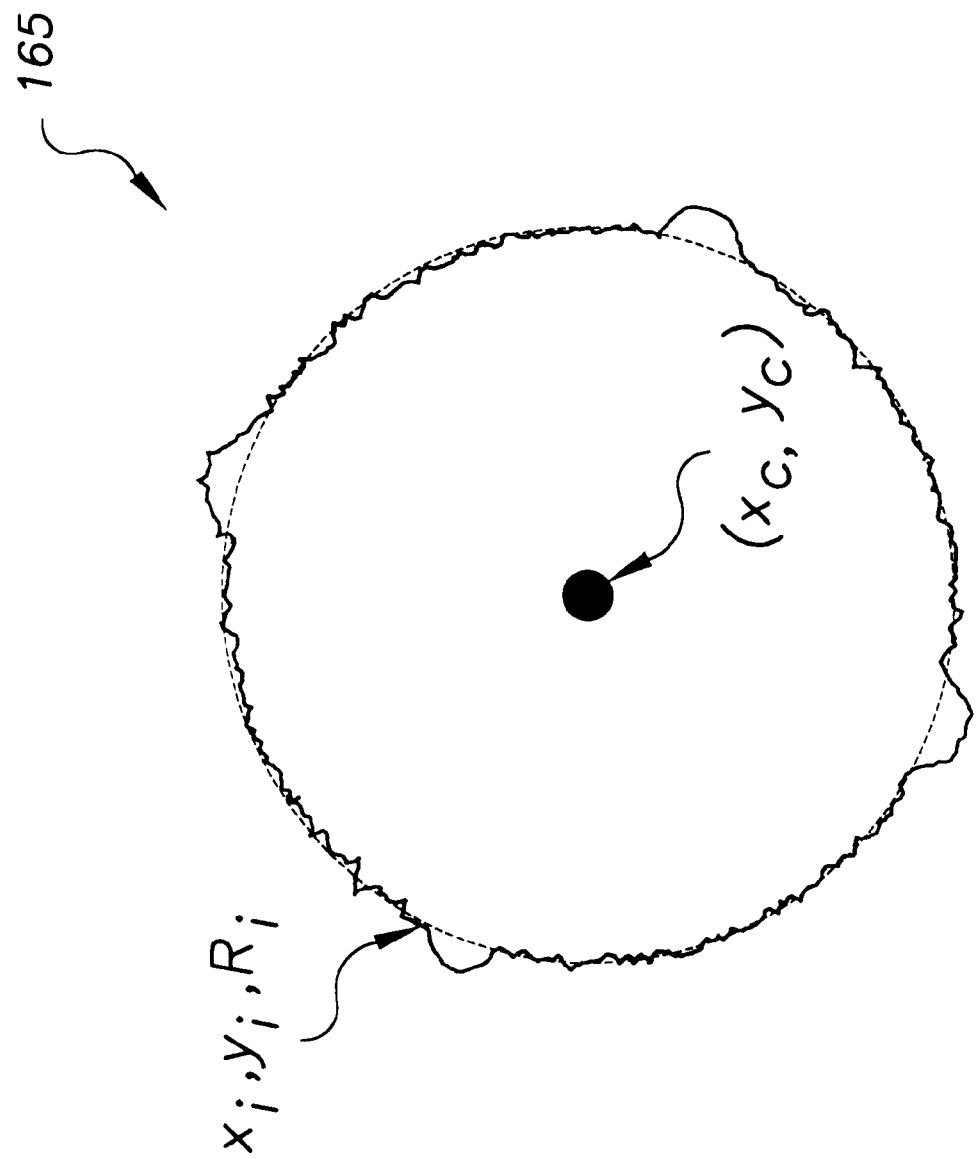
FIG. 9 is a schematic representation of an orthogonal view of a crystalline ingot-melt meniscus produced by the technique of the flow diagram of FIG. 7.

The elliptical meniscus points and center point are transformed to the physical coordinate system to produce an orthogonal view, as shown in FIG. 9, of a meniscus cross-sectional profile 165, with a specified orthogonal center point, $(x_c, y_c)$ and the transformed meniscus points. One example point is shown having coordinates $x_i$, $y_i$, and $R_i$. The parameter $R_i$ is the radius of the $i^{th}$ meniscus point, to be computed in step 136. Here, having determined the center of the meniscus, and having determined the X-axis and Y-axis coordinates for each meniscus point, the radius of each meniscus point can be computed as:

$$R_i = \sqrt{(x_i - x_c)^2 + (y_i - y_c)^2}. \tag{16}$$

With the radius of each meniscus point determined for the orthogonal physical representation of the meniscus, the next step 138, of detecting facets along the meniscus, can be carried out. In one example technique provided by the invention, facets are detected along the meniscus by differentiating facet points from non-facets points based on the radius of the meniscus points. Non-facet meniscus points have radii that are relatively similar to each other and to a statistical average for points of a circle that represents the orthogonal physical meniscus. In contrast, facet points have radii that deviate from the meniscus circle in a statistically significant manner. For many applications, and particularly for the crystal growth application described here, image-to-image fluctuations in feature appearance, e.g., meniscus appearance, can be significant due to noise, changing process conditions, and other factors. It is thus preferred that the facet detection process impose statistical parameters from which detection can be judged.

Referring to FIG. 10, facet detection can be accomplished by a sequence of operations with a starting step 170 wherein a data structure of the meniscus radius points is available. Then in a first processing step 172 the mean radius, $\bar{R}$, of the set of meniscus points is subtracted from each meniscus point, $R_i$. This produces a set of meniscus radius offset points, $R_{i,offset}$. The mean radius of the meniscus can be determined as:

$$\bar{R} = \frac{\sum_{i=1}^{n} R_i}{n}; \tag{17}$$

where n is the number of meniscus points produced by the sequence of M images. With this mean radius, each meniscus radius offset point is then determined as:

$$R_{i,offset} = R_i - \bar{R}. \tag{18}$$

Figure 11A:
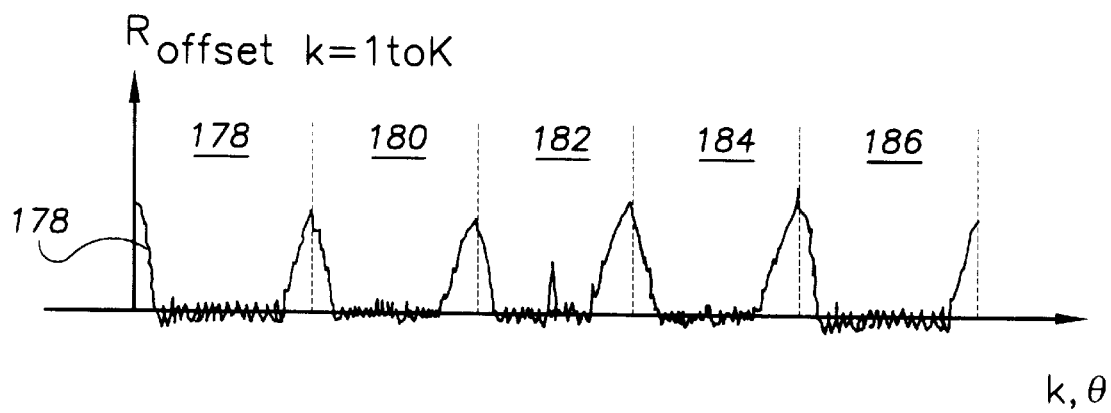
FIGS. 11A–11C are plots of meniscus radii offset values as a function of meniscus angle, produced by the technique of the flow diagram of FIG. 10.

The facet detection analysis can be discussed clearly, referring to FIG. 11A, with a representation of the meniscus radius offset points as a function of radius angle. Recall that the orthogonal physical representation of the meniscus is based on an indication of the proper orientation of each meniscus point with reference to the physical meniscus being monitored. Each detected meniscus point and its radius has an assigned contour angle that was imposed by the previous physical correlation operation. Each meniscus radius offset point can thus be mapped to a representation of meniscus radius offset as a function of meniscus angle as shown in the figure. In the next step 174 of the facet detection process, to produce the angular mapping of the radii offsets, an angular resolution is imposed, preferably that accounts for camera resolution, image noise, and other such factors. The 360° meniscus circumference is accordingly segmented into a number, K, of bins, with each bin in a sequence of k=1 to K bins including some specified meniscus arc, e.g., 1°. The values of all the meniscus radius offset points that were assigned to angles which fall within a given bin are then averaged to produce a radius offset bin value, $R_{offset\ k=1\ to\ K}$ for the K bins in the meniscus circumference.

With the radius offset value of each bin determined, in the next step 176 the radius offset bin values are then mapped to the angular radii plot. The example bin mapping shown in FIG. 11A includes several regions, such as region 176, that are provided as example facet regions. It is seen that a feature such as a facet 176 may be partially split at the starting angle of the meniscus circumferential "unwrapping." To ensure that the possibility of this condition is accommodated, it is preferred to pad the bin mapping in a manner that compensates for the unwrapping. For example, as shown in the figure, the circumference is designated as including four bin sections 178, 180, 182, 184 that together encompass the complete circumference. A padding bin section 186 that is a duplicate of the first bin section 178 is added at the end of the unwrapped representation such that a complete representation of any features at the starting angle of the circumference is provided. As can be recognized, the use of a circular data structure to represent the radius-to-angle correspondence can be employed to eliminate the need for this padding technique.

As can be seen from FIG. 11A, the radius offset values fluctuate around some mean value. The mean value for non-facet bin locations is relatively small, while the mean value of the regions that are likely to be facets is noticeably larger. In accordance with the invention, facet regions are determined as those regions having a mean offset radius value that exceeds statistical fluctuations of known non-facet regions. Accordingly, in a next step 188 of the process, a statistical estimation of the radius offset value in a non-facet region of the meniscus is determined. Specifically, the magnitude of statistical fluctuation of non-facet regions is computed.

Figure 11B:
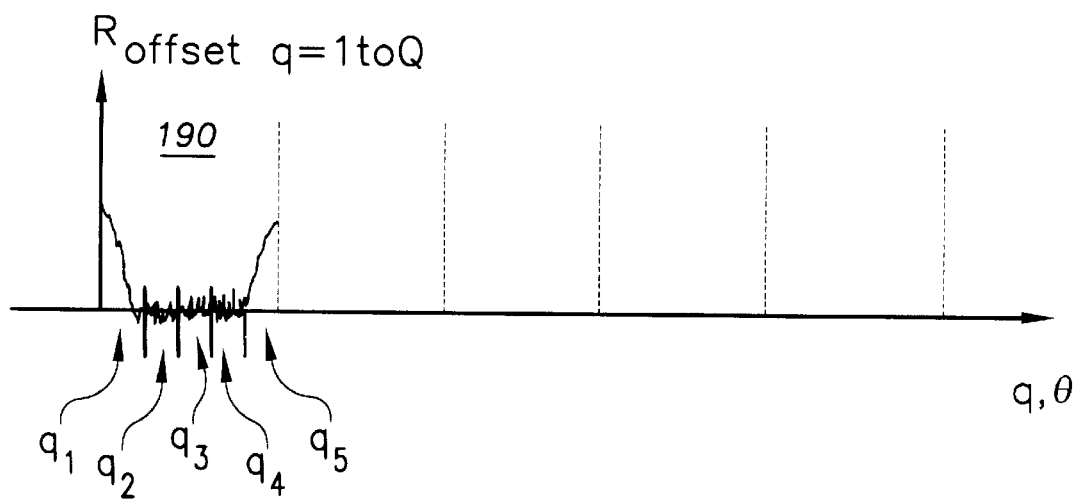

Referring to FIG. 11B, for the example case of evaluation of four facet regions of expected width and location, non-facet regions can be identified as follows. Each of the four bin sections 178, 180, 182, 184 of the unwrapped meniscus representation of FIG. 11 A is correlated to a common segment 190 as shown in FIG. 11B, and the common segment is divided into a number of subregions, q=1 to Q subregions. Five example subregions, $q_1$–$q_5$ are shown. The four bin sections are thus superimposed in a sense. This representation is for discussion purposes only; the bin values are not here combined, but only associated with a common subregion. The length of the common segment corresponds to one-quarter of the meniscus circumference specifically because four facets are expected. It is thus to be understood that for other facet configurations, and for other feature configurations, an alternative representation would be appropriate.

The number of Q subregions in the superimposed segment is based on the expected width of each facet region, and specifically is based on a given expectation for the fraction of one-quarter of the meniscus circumference that is covered by a facet, given a prespecified expected facet width. Preferably, the number of subregions is selected such that at least one subregion can be expected to be a non-facet region. For an example of four expected facets, the imposition of at least Q=3 subregions accomplishes this condition. The imposition of five subregions as shown in FIG. 11B produces three non-facet regions.

To determine which subregions are non-facet subregions, the root-mean-square value, $S_q$, of each subregion is determined as:

$$S_q = \sqrt{\frac{\sum_{k=1}^{K} R^2_{offsetk}}{N_q}} \quad ; \quad (19)$$

where $R^2_{offset\ k}$ is the square of the radius offset bin value from FIG. 11A for each of the designated k=1 to K bins, and $N_q$ is the number of bins in subregion q, taking into account that four regions of bins are superimposed in each subregion.

With the root-mean-square value for each of the q=1 to Q subregions computed, the computed values are sorted in descending order. Then the facet-to-non-facet ratio of the quarter circumference region is imposed to consider the values. Where, e.g., it is known that at most two subregions will be facet regions, then the highest two root-mean-square values are discarded. The remaining subregion root-mean-square values are then employed to produce a statistical threshold value. This is carried out, for example, by averaging the remaining subregion root-mean-square values and then multiplying the average value by a probability factor, P, to produce a threshold, H, as:

$$H = \frac{\sum_{q=(Q-D)}^{Q} S_q}{Q - D} \cdot P; \quad (20)$$

where $S_q$ is the root-mean-square value computed from expression (19), Q is the number of subregions, and D is the number of subregions that were discarded as being representative of facet regions. The probability factor, P, is selected based on the noise of the camera and processing electronics, the variability of the process being monitored, and other similar factors, and typically should range between about 1 and about 4.

Figure 11C:
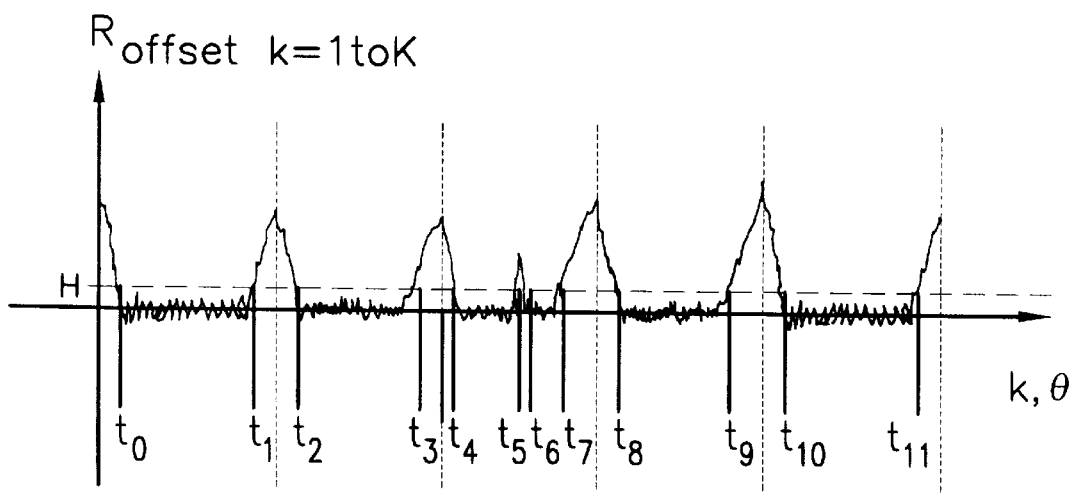

The expression (20) above provides a threshold value that represents the maximum expected statistical fluctuation in meniscus radius offset values for non-facet regions of the meniscus. Any meniscus regions having a radius offset value greater than the threshold can thus be indicated as facet regions. Referring to FIG. 11C, and the flow diagram of FIG. 10, in a next step 190, the threshold H is applied to the bins of the meniscus circumference as given in FIG. 11A to determine which of the bins correspond to facet regions.

In applying the threshold, H, each bin at which the threshold is crossed, either by increasing above the threshold from one bin to the next, or by falling below the threshold from one bin to the next, is recorded as a set of transition points, t=$t_0$ to $t_m$, with the example of m=11 transition points as shown in FIG. 11C. Then beginning with the first transition point, $t_1$, each point is paired with the next adjacent point to define a transition region. The initial reference axis is used as a pair point with the first transition point, $t_1$. Thereafter, point $t_1$ is paired with point $t_2$, point $t_2$ is paired with point $t_3$, and so on, to define a transition region between each of the transition points.

The bin values in each transition region are then examined to determine if they exceed the threshold, H. Given that a each transition region is composed of a number of bins that fall between point of transition above or below the threshold, then all bins in a given transition region will be of a value above or below the threshold. As a result, only one bin value in each transition region need be examined. If the examined bin value in a given transition region exceeds the threshold value, then that transition region is indicated to be a candidate facet region. Those transition regions having for which the at least one examined bin value is less than the threshold value are indicated to be non-facet regions.

The candidate facet regions are then examined for their duration. Recall that the width of the facets are prespecified as a fraction of the number of subregions defined in FIG. 11B, and thus can be compared to the candidate facet regions. Accordingly, the minimum length, L, required for a candidate region to be verified as a facet region can be determined as:

$$L = K/(G \cdot Q \cdot \alpha); \quad (21)$$

where K is the number of bins into which the meniscus circumference is divided, and G is the number of circumference sections that are superimposed into a single segment of subregions in FIG. 11B, where the example of G=4 is given. The number of subregions in the single segment is given as Q and the multiplier a is a tolerance coefficient that is less than 1, selected based on the expected noise of the process, image acquisition, and processing electronics.

All candidate facet regions having a length value that is less than L are rejected as attributable to noise, and all candidate facet regions having a length value that is at least L are confirmed as facet regions. In the next step 192 of the flow diagram of FIG. 10, the coordinates of each facet region are then recorded by indicating the starting point of the facet region and the ending point of the facet region, by indicating the bin angle for the start and end of each facet. With an end step 194, the facet detection step 138 of the flow diagram of FIG. 7 is complete.

Now referring back to FIG. 7, in a next step, it is determined if the number of confirmed facet regions corresponds to the number of expected facet regions. For example, for monitoring application of a <100>-oriented crystal ingot, it is determined if four facet regions are confirmed. If four regions are not confirmed, then in a step 142 is it reported that a dislocation has been introduced to the ingot.

If four confirmed facet regions are found, then in the next step 144 the symmetry of the facet locations is examined to measure the spacing between the facets around the meniscus circumference. To complete this measurement, the center point of each facet region is first computed by summing the start and end angles of the facet region and dividing the sum in half to specify a center facet angle. Then the distance between adjacent facets is determined by computing the difference between the two facet region center angles. The computed facet-to-facet distance is then compared with one-quarter of the known angular duration of the bin collection from FIG. 11A. As can be recognized, the expected facet-to-facet spacing can be modified based on empirical data for a given crystal growth operation, and can be modified based on a tolerance or probability factor in the manner that was employed above for the minimum facet width.

If it is found that the spacing between one or more pairs of facets does not correlate with the expected facet-to-facet spacing, then as shown in FIG. 7, the reporting step 142 is carried out to indicate that a dislocation has appeared. If it is found that all facet pairs correlate with the expected facet spacing, then a next step 150 is carried out to determine if the shape of each facet is symmetrical with that facet located 180° around the meniscus circumference. To carry out this determination, two such opposing facets are compared on a bin-by-bin basis across the two facets, using the bin values produced in connection with FIG. 11A. Specifically, the difference between the values in each pair of corresponding bins for the two facet regions is determined, and that difference is compared to the variance of the radius offset values for the non-facet regions. If the difference between bins in all bin pairs for the two facets is found to be comparable to the radius offset variance, then the two facets are judged to be symmetrical, and step 152 is carried out to report no appearance of dislocations; otherwise, it is then reported in step 142 that a dislocation has appeared.

This determination can be carried out in one step across all bin pairs by computing a statistical difference coefficient, $x^2$, across two opposing facet regions, as:

$$\chi^2 = \sum_{b=1}^{B} \frac{(R_{b1} - R_{b2})^2}{\sigma^2(M_{b1} + M_{b2})}; \tag{22}$$

where b=1 to B is the number of bins in a facet region; $R_{b1}$ is the radius offset for the $b^{th}$ bin of the first facet region under consideration; $R_{b2}$ is the radius offset for the $b^{th}$ bin of the second face region under consideration, $\sigma^2$ is the variance of all the radius offset values of the non-facet region bins in the meniscus circumference; $M_{b1}$ is the number of meniscus radius offset points that were averaged to produce the $b^{th}$ bin value of the first facet region under consideration; and $M_{b2}$ is the number of meniscus radius offset points that were averaged to produce the $b^{th}$ bin value of the second facet region under consideration.

If the difference between the bin values of the two facet regions under consideration is comparable to statistical fluctuations of the non-facet regions, then the ratio of the two will by definition be close to unity, and the value of the statistical difference coefficient, $X^2$, will correspondingly be close to the value for the number of facet region bins, B; otherwise, the difference coefficient value will significantly exceed the value of the bin variable, B. In one example scenario, the value of the statistical difference coefficient, $X^2$, is compared to a value of 3B; any coefficient value larger than 3B is then indicated to signify the loss of symmetry between two opposing facets and the corresponding appearance of a dislocation in the growing semiconductor ingot.

As can be recognized, the capabilities of this example process for detecting the introduction of a dislocation into a growing semiconductor ingot can be adapted and extended to other machine vision applications. The process provides the ability to produce a circumferential profile of a complicated three-dimensional object and to analyze features along the profile. The complete set of facet analysis operations described above need not be carried out, i.e., only one or more of the operations may be needed for a given monitoring process, and each analysis operation need not be carried out on all facets, depending on the requirements of a given monitoring process.

Various techniques can be employed with the process to detect features other than the example ingot facet features of the example here. The features can be of a smaller radius than other profile points, rather than larger as in the case of the ingot facets, or can exhibit some other distinguishing characteristic that can be exploited to detect the feature location. The shape, location, size, or other attribute of the detected features can be investigated for making judgments about the feature set and the object.

In general, the process provides a method for ascertaining an orthogonal view of some object plane, even a cross-sectional circumferential plane, of a three-dimensional object, and even when regions of the object obscure other object portions required for reconstruction of the desired orthogonal view. In the semiconductor crystal growth process, the growing ingot obscures portions of the ingot, the melt, and the ingot-melt meniscus from a perspective view of the growth process. But the machine vision process of the invention overcomes this limitation to produce a representation of the entire meniscus, ingot, and melt. The technique thereby enables the extraction of various two-dimensional feature information from a complicated three-dimensional configuration. It is of particular note that this can be accomplished in accordance with the invention with the use of only one camera, where a human interpretation of the three-dimensional configuration requires stereo optical processing of the image. It is to be recognized, however, that for a suitable application, more than one camera can be employed. A multi-camera configuration enables simultaneous analysis of multiple feature planes of interest, enables analysis of opposing sides of a feature surface, and enables three-dimensional analysis of object feature orientations.

The machine vision techniques of the invention can thus be applied to a wide range of applications where feature analysis of a complicated three-dimensional configuration is required. The profile of an object at some position along an axis of the object can be determined for, e.g., inspection purposes. Glass blowing, cable twisting, and molding operations can here be monitored in real time to ensure correct part production. Where the profile position of interest does not include distinctive lighting or surface relief features, a line of light can be projected at the position of interest to enable detection of points along that position. In other applications, several object profiles taken at different positions along an object can be analyzed to enable various determinations about the object. In other applications, the presence of a required surface feature along a line or lines on an object can be confirmed, or the configuration of an object with respect to a tooling or processing set up can be confirmed.

It is thus to be recognized that the invention contemplates wide applicability of the machine vision techniques described above. Complicated and unpredictable three-dimensional object and feature sizes and shapes are accommodated by the techniques as surface feature information is extracted and analyzed. Only one camera is required to produce a complete representation of an object even for applications where some object regions may obscure others. A wide range of feature analysis techniques, including a technique for analyzing the spacing and symmetry of features along a cross-section circumferential profile, are enabled. It is recognized, of course, that those skilled in the art may make various modifications and additions to the image acquisition and feature analysis techniques described above without departing from the spirit and scope of the present contribution to the art. Accordingly, it is to be understood that the protection sought to be afforded hereby should be deemed to extend to the subject matter of the claims and all equivalents thereof fairly within the scope of the invention.

Appendix

In an example process for fitting the parameters of an ellipse to a set of detected ellipse points, first is solved a system of four linear equations whose coefficients are computed from the set of detected points. The solution to the linear system is then imposed on a set of nonlinear equations to derive the ellipse parameters of the center point $(x_c, y_c)$, the major axis, a, and the minor axis, b.

The equation of an ellipse is given as:

$$\frac{(x-x_c)^2}{a^2} + \frac{(y-y_c)^2}{b^2} = 0; \quad (a)$$

or equivalently:

$$x^2 + c_1 \cdot x + c_2 \cdot y^2 + c_3 \cdot y + c_4 = 0, \quad (b)$$

where:

$c_1 = -2 \cdot x_c$,
$c_2 = a^2/b^2$,
$c_3 = -2 \cdot (a^2/b^2) \cdot y_c$, and
$c_4 = x_c^2 + (a^2/b^2) \cdot y_c^2 - a^2$.

Given a number, n, of detected ellipse coordinate points, $(x_i, y_i)$, where i=1 to n, a mean squared error, E, is given as:

$$E = \sum_{i=1}^{n} (x_i^2 + c_1 \cdot x_i + c_2 \cdot y_i^2 + c_3 \cdot y_i + c_4)^2. \quad (c)$$

The minimum of the error value, E, can be obtained by solving for the four constants, $c_1$, $c_2$, $c_3$, and $c_4$, that satisfy the normal equations:

$$0 = \frac{\partial E}{\partial c_1} = 2 \sum_i [x_i \cdot (x_i^2 + c_i \cdot x_i + c_2 \cdot y_i^2 + c_3 \cdot y_i + c_4)] \quad (d)$$

$$0 = \frac{\partial E}{\partial c_2} = 2 \sum_i [y_i^2 \cdot (x_i^2 + c_i \cdot x_i + c_2 \cdot y_i^2 + c_3 \cdot y_i + c_4)] \quad (e)$$

$$0 = \frac{\partial E}{\partial c_3} = 2 \sum_i [y_i \cdot (x_i^2 + c_i \cdot x_i + c_2 \cdot y_i^2 + c_3 \cdot y_i + c_4)] \quad (f)$$

$$0 = \frac{\partial E}{\partial c_4} = 2 \sum_i [x_i^2 \cdot (x_i^2 + c_i \cdot x_i + c_2 \cdot y_i^2 + c_3 \cdot y_i + c_4)] \quad (g)$$

where $$\frac{\partial E}{\partial c_1}$$

denotes the partial differentiation of E with respect to $c_1$.

The above expressions (d)–(g) with four unknowns can be written in matrix form as:

$$\begin{bmatrix} \sum_i x_i^2 & \sum_i x_i \cdot y_i^2 & \sum_i x_i \cdot y_i & \sum_i x_i \\ \sum_i x_i \cdot y_i^2 & \sum_i y_i^4 & \sum_i y_i^3 & \sum_i y_i^2 \\ \sum_i x_i \cdot y_i & \sum_i y_i^3 & \sum_i y_i^2 & \sum_i y_i \\ \sum_i x_i & \sum_i y_i^2 & \sum_i y_i & n \end{bmatrix} \begin{bmatrix} c_1 \\ c_2 \\ c_3 \\ c_4 \end{bmatrix} = \begin{bmatrix} -\sum_i x_i^3 \\ -\sum_i x_i^2 \cdot y_i^2 \\ -\sum_i x_i^2 \cdot y_i \\ -\sum_i x_i^2 \end{bmatrix}. \quad (h)$$

After solving the above matrix expression for the constants, $c_1$, $c_2$, $c_{C3}$, and $c_4$, the constants are imposed on the expressions (a) and (b) above to produce the resulting center point coordinates as:

$$x_c = -c_1/2 \text{ and } y_c = -c_3/(2 \cdot c_2). \quad (i)$$

The major and minor radii, a, and b, respectively, of the ellipse are then given as:

$$a = \sqrt{-c_4 + \frac{c_1^2}{4} + \frac{c_3^2}{4 c_2}} \quad \text{and} \quad b = \sqrt{\frac{1}{2}\left(-c_4 + \frac{c_1^2}{4} + \frac{c_3^2}{4 c_2}\right)} \quad (j)$$

These expressions for the ellipse center point, ellipse major axis, and ellipse minor axis, are evaluated for the image coordinate system projection of the circular meniscus as described above.

The physical Z-axis location of the feature plane of the circular ellipse can then be determined as:

$$z = \frac{f + d}{(a^2 + f^2) \cdot \sin(\theta) + f \cdot y_c \cdot \cos(\theta)} \cdot \quad (k)$$

$$[f \cdot y_c + a^2 \cdot \sin(\theta) \cdot \cos(\theta)];$$

where f is the focal length of the image acquisition camera, and $\theta$ is the viewing angle, both as defined in FIG. 2. The resulting z value is the location along the physical Z-axis of the physical meniscus.

What is claimed is:

1. A machine vision method for producing a representation of a selected feature plane of an object in a physical coordinate system of the object, the method comprising:

acquiring a plurality of images of the object that each correspond to a distinct orientation of the object about a selected object axis;

identifying, in at least one acquired image, feature points in the selected feature plane as-projected into that acquired image;

associating feature points with the selected feature plane in the physical coordinate system of the object; and correlating feature points from at least one acquired image with physical orientations on the selected feature plane in the physical coordinate system of the object, based on the object orientation corresponding to that acquired image and wherein acquiring a plurality of object images; comprises acquiring a sequence of object images, and wherein correlating feature points comprises correlating feature points to a physical orientation on the selected feature plane based on order position of that image in the sequence of images and based on difference in object orientation between adjacent images in the sequence.

2. A machine vision method for producing a representation of a selected feature plane of an object in a physical coordinate system of the object, the method comprising:

acquiring a plurality of perspective-view images of the object that each correspond to a perspective view of a distinct orientation of the object about a selected object axis;

identifying, in at least one acquired perspective-view image, feature points in the selected feature plane as-projected into that acquired image;

mapping feature points from the perspective-view image projection to the selected feature plane in the physical coordinate system of the object; and correlating feature points from at least one acquired image with physical orientations on the selected feature plane in the physical coordinate system of the object, based on the object orientation corresponding to that acquired image; and wherein acquiring a plurality of object images comprises acquiring a sequence of object images, and wherein correlating feature points comprises correlating feature points to a physical orientation on the selected feature plane based on order position of that image in the sequence of images and based on difference in object orientation between adjacent images in the sequence.

3. The method of claim 1 wherein acquiring a plurality of object images comprises acquiring a sequence of object images from a fixed viewing location as the object rotates about the selected object axis.

4. The method of claim 1 wherein acquiring a plurality of object images comprises acquiring a sequence of object images by rotating an image acquisition camera about the selected object axis as the camera produces object images.

5. The method of claim 2 wherein mapping feature points comprises mapping feature points from a two-dimensional image coordinate system that is parallel with a selected perspective view to a three-dimensional coordinate system that is aligned with the selected object axis.

6. The method of claim 5 wherein the selected feature plane of the object is a plane perpendicular to the selected object axis.

7. The method of claim 6 wherein acquiring a plurality of perspective-view object images comprises acquiring a sequence of perspective-view object images from a fixed viewing location as the object rotates about the selected object axis.

8. The method of claim 7 wherein the selected object axis is a vertical axis of revolution and wherein the selected feature plane is a horizontal plane located at a position along the axis of revolution.

9. The method of claim 8 wherein identifying feature points in the selected horizontal feature plane comprises detecting circumferential feature points of the object.

10. The method of claim 1 wherein acquiring a plurality of object images comprises acquiring a sequence of object images, a portion of each image in the sequence being common with a portion of an adjacent image in the sequence.

11. The method of claim 1 wherein acquiring a plurality of object images comprises acquiring a video sequence of object images.

12. The method of claim 3 wherein acquiring a plurality of object images comprises acquiring a sequence of at least a minimum number, M, of object images, where M is selected as $M=T_0/T_a$, where $T_0$ is a period of revolution of the object and $T_a$ is a period required for acquiring one image.

13. The method of claim 1 wherein acquiring a sequence of object images comprises acquiring the image sequence from a fixed viewing location as the object rotates about the selected object axis, and wherein correlating feature points with physical orientations is determined by order position of images in the sequence and by angular object orientation offset between adjacent images in the sequence.

14. The method of claim 1 wherein identifying feature points in an image comprises searching for feature points in an area of the image where feature points are expected.

15. The method of claim 14 wherein searching for feature points in an area of an image where feature points are expected comprises:

applying a plurality of edge detection regions in that image at image positions corresponding to an expected image location of the feature plane projection;

searching each edge detection region for an edge of a feature point; and correlating positions of detected edges to feature point positions in that image.

16. The method of claim 15 wherein searching for feature points in an area of an image where feature points are expected further comprises adjusting the expected location of the feature plane projection if a feature point edge is not detected in at least a specified minimum number of edge detection regions.

17. The method of claim 1 further comprising analyzing the representation of the selected feature plane for a specified feature configuration.

18. A machine vision method for producing a representation of a selected feature plane of an object, in a physical coordinate system of the object, as the object rotates about an axis of rotation that is perpendicular to the selected feature plane, the method comprising:

acquiring a sequence of perspective-view object images from a fixed viewing location as the object rotates about the axis of rotation, each perspective-view image corresponding to a perspective view of a distinct angular orientation of the object about the axis of object rotation;

identifying, in at least one acquired perspective-view image, feature points in the selected feature plane as-projected into that acquired image;

mapping feature points from the perspective-view image projection to the selected feature plane in the physical coordinate system of the object; and correlating feature points from at least one acquired image with physical orientations on the selected feature plane in the physical coordinate system of the object, based on the distinct angular object orientation between adjacent images in the sequence and order position of that acquired image in the image sequence.

19. A machine vision method for analyzing a representation of a semiconductor melt surface from which a semiconductor crystal ingot is vertically pulled, in a physical coordinate system of the ingot, as the ingot is rotated in a first direction about a vertical axis of rotation and the melt is rotated in a second direction about the vertical axis of rotation, the method comprising:

acquiring a sequence of perspective-view images of the melt surface from a fixed viewing location, each perspective-view image corresponding to a perspective view of a distinct angular orientation of the ingot and the melt surface about the axis of rotation;

identifying, in at least one acquired perspective-view image, feature points in the melt surface as-projected into that image;

mapping identified feature points from the perspective-view image projection to the melt surface in the physical coordinate system of the ingot;

correlating mapped melt feature points from at least one acquired image with physical orientations on the melt surface in the physical coordinate system of the ingot, based on the distinct angular orientation corresponding to that acquired image and order position of that acquired image in the image sequence; and analyzing the the melt surface features for a prespecified feature configuration.

20. A machine vision method for analyzing a representation of a selected cross-sectional circumferential contour of an object, in a physical coordinate system of the object, as the object rotates about an axis of rotation, the method comprising:

acquiring a sequence of perspective-view object images from a fixed viewing location as the object rotates about the axis of rotation, each perspective-view image corresponding to a perspective view of a distinct angular orientation of the object about the axis of object rotation;

identifying, in at least one acquired perspective-view image, circumferential contour points in a feature plane corresponding to the selected cross-sectional circumferential contour and as-projected into that acquired image;

mapping circumferential contour points from the perspective-view image projection to the selected circumferential contour in the physical coordinate system of the object;

correlating circumferential contour points from at least one acquired image with physical locations around the circumferential contour in the physical coordinate system of the object, based on the distinct angular object orientation corresponding to that acquired image and order position of that acquired image in the image sequence; and analyzing the correlated circumferential contour points based on an expected configuration of features along the contour.

21. The method of claim 20 wherein the feature plane corresponding to the selected cross-sectional circumferential contour is a plane that is perpendicular to the axis of object rotation.

22. The method of claim 20 wherein analyzing the correlated circumferential contour points comprises:

detecting contour features along the circumferential contour; and analyzing location of the detected contour features based on an expectation for feature location.

23. The method of claim 20 wherein analyzing the correlated circumferential contour points comprises:

detecting contour features along the circumferential contour; and analyzing number of the detected contour features based on an expectation for feature number.

24. The method of claim 20 wherein analyzing the correlated circumferential contour points comprises:

detecting contour features along the circumferential contour; and analyzing shape of the detected contour features based on an expectation for feature shape.

25. The method of claim 20 further comprising producing an indication of a degree of compliance of the circumferential contour with an expected contour feature configuration.

26. The method of claim 20 wherein analyzing the correlated circumferential contour points comprises:

determining a center point of the circumferential contour;

determining a radius for each contour point referenced to the center point;

determining for the contour points a mean center point-to-contour point radius;

producing an offset radius for each contour point corresponding to a difference between that contour point's radius and the mean radius;

correlating each radius offset with an arc along the contour, each arc specified with an arc radius offset value that is an average of all radius offset values correlated with that arc;

estimating a statistical fluctuation of radius offset values for a plurality of arcs known to not include a contour feature;

applying a radius offset threshold, based on the estimated radius offset value statistical fluctuation, to detect candidate contour feature locations along the contour arcs;

applying a prespecified feature width threshold to the candidate contour feature locations to confirm contour features of the circumferential contour; and analyzing the detected contour features based on an expected contour feature configuration.

27. A machine vision method for analyzing representation of a cross-sectional meniscus contour produced by a semiconductor ingot on a semiconductor melt surface, in a physical coordinate system of the ingot, as the ingot is vertically pulled out of the melt surface and the ingot and melt are rotated in opposite directions about a common vertical axis of rotation, the method comprising:

acquiring a sequence of perspective-view images of the ingot and melt from a fixed viewing location, each perspective-view image corresponding to a perspective view of a distinct angular orientation of the ingot and melt surface about the axis of rotation;

identifying, in at least one acquired perspective-view image, meniscus contour points as-projected into that acquired image;

mapping identified meniscus contour points from the perspective-view image projection to the meniscus contour in the physical coordinate system of the ingot;

correlating mapped meniscus contour points from at least one acquired image with physical orientations around the meniscus in the physical coordinate system of the ingot, based on the distinct angular orientation corresponding to that image and order position of that image in the image sequence; and analyzing the correlated meniscus contour points to determine if a fault condition has occurred.

28. The method of claim 27 wherein analyzing the correlated meniscus contour points comprises:

detecting ingot crystalline facets along the meniscus contour; and analyzing locations of detected crystalline facets based on an expectation for facet location.

29. The method of claim 27 wherein analyzing the correlated meniscus contour points comprises:

detecting ingot crystalline facets along the meniscus contour; and analyzing number of the detected crystalline facets based on an expectation for facet number.

30. The method of claim 27 wherein analyzing the correlated meniscus contour points comprises:

detecting ingot crystalline facets along the meniscus contour; and analyzing shape of detected crystalline facets based on an expectation for facet shape symmetry.

31. The method of claim 27 further comprising producing an indication of a fault condition for the semiconductor ingot if the meniscus contour is found to include crystalline facets that do not comply with an expected facet configuration.

32. The method of claim 27 wherein analyzing the correlated meniscus contour points comprises:

determining a center point of the meniscus contour;

determining a radius for each contour point referenced to the center point;

determining for the contour points a mean center point-to-contour point radius;

producing an offset radius for each contour point corresponding to a difference between that contour point's radius and the mean radius;

correlating each radius offset to an arc along the contour, each arc specified with an arc radius offset value that is an average of all radius offset values correlated to that arc;

estimating a statistical fluctuation of radius offset values for a plurality of arcs known to not include an ingot crystalline facet;

applying a radius offset threshold, based on the estimated radius offset value statistical fluctuation, to detect candidate crystalline facet locations along the contour arcs;

applying a prespecified crystalline facet width threshold to the candidate crystalline facet locations to confirm detected crystalline facets; and analyzing the detected crystalline facets based on an expected facet configuration.

33. A machine vision system for producing a representation of a selected feature plane of an object in a physical coordinate system of the object, the system comprising:

means for acquiring a plurality of images of the object that each correspond to a distinct orientation of the object about a selected object axis;

means for identifying, in at least one acquired image, feature points in the selected feature plane as-projected into that acquired image;

means for associating feature points with the selected feature plane in the physical coordinate system of the object; and means for correlating feature points from at least one acquired image with physical orientations on the selected feature plane in a physical coordinate system of the object, based on the object orientation corresponding to that acquired image; and wherein acquiring a plurality of object images comprises acquiring a sequence of object images, and wherein correlating feature points comprises correlating feature points to a physical orientation on the selected feature plane based on order position of that image in the sequence of images and based on difference in object orientation between adjacent images in the sequence.

34. A machine vision system for producing a representation of a selected feature plane of an object in a physical coordinate system of the object, the system comprising:

means for acquiring a plurality of perspective-view images of the object that each correspond to a perspective view of a distinct orientation of the object about a selected object axis;

means for identifying, in at least one acquired perspective-view image, feature points in the selected feature plane as-projected into that acquired image;

means for mapping feature points from the perspective-view image projection to the selected feature plane in the physical coordinate system of the object; and means for correlating feature points from at least one acquired image with physical orientations on the selected feature plane in the physical coordinate system of the object, based on the object orientation corresponding to that acquired image; and wherein acquiring a plurality of object images comprises acquiring a sequence of object images, and wherein correlating feature points comprises correlating feature points to a physical orientation on the selected feature plane based on order position of that image in the sequence of images and based on difference in object orientation between adjacent images in the sequence.

35. A machine vision system for producing a representation of a selected feature plane of an object, in a physical coordinate system of the object, as the object rotates about an axis of rotation that is perpendicular to the selected feature plane, the system comprising:

means for acquiring a sequence of perspective-view object images from a fixed viewing location as the object rotates about the axis of rotation, each perspective-view image corresponding to a perspective view of a distinct angular orientation of the object about the axis of object rotation;

means for identifying, in at least one acquired perspective-view image, feature points in the selected feature plane as-projected into that acquired image;

means for mapping feature points from the perspective-view image projection to the selected feature plane in the physical coordinate system of the object; and means for correlating feature points from at least one acquired image with physical orientations on the selected feature plane in the physical coordinate system of the object, based on the distinct angular object orientation between adjacent imges in the sequene and order position of that acquired image in the image sequence.

36. A machine vision system for analyzing a representation of a semiconductor melt surface from which a semiconductor crystal ingot is vertically pulled, in a physical coordinate system of the ingot, as the ingot is rotated in a first direction about a vertical axis of rotation and the melt is rotated in a second direction about the vertical axis of rotation, the system comprising:

means for acquiring a sequence of perspective-view images of the melt surface from a fixed viewing location, each perspective-view image corresponding to a perspective view of a distinct angular orientation of the ingot and the melt surface about the axis of rotation;

means for identifying, in at least one acquired perspective-view image, feature points in the melt surface as-projected into that image;

means for mapping identified feature points from the perspective-view image projection to the melt surface in the physical coordinate system of the ingot;

means for correlating mapped melt feature points from at least one acquired image with physical orientations on the melt surface in the physical coordinate system of the ingot, based on the distinct angular orientation corresponding to that acquired image and order position of that acquired image in the image sequence; and means for analyzing the the melt surface features for a prespecified feature configuration.

37. A machine vision system for analyzing a representation of a selected cross-sectional circumferential contour of an object, in a physical coordinate system of the object, as the object rotates about an axis of rotation, the system comprising:

means for acquiring a sequence of perspective-view object images from a fixed viewing location as the object rotates about the axis of rotation, each perspective-view image corresponding to a perspective view of a distinct angular orientation of the object about the axis of object rotation;

means for identifying, in at least one acquired perspective-view image, circumferential contour points in a feature plane corresponding to the selected cross-sectional circumferential contour and as-projected into that acquired image;

means for mapping circumferential contour points from the perspective-view image projection to the selected circumferential contour in the physical coordinate system of the object;

means for correlating circumferential contour points from at least one acquired image with physical locations around the circumferential contour in the physical coordinate system of the object, based on the distinct angular object orientation corresponding to that acquired image and order position of that acquired image in the image sequence; and means for analyzing the correlated circumferential contour points based on an expected configuration of features along the contour.

38. A machine vision system for analyzing a representation of a cross-sectional meniscus contour produced by a semiconductor ingot on a semiconductor melt surface, in a physical coordinate system of the ingot, as the ingot is vertically pulled out of the melt surface and the ingot and melt are rotated in opposite directions about a common vertical axis of rotation, the system comprising:

means for acquiring a sequence of perspective-view images of the ingot and melt from a fixed viewing location, each perspective-view image corresponding to a perspective view of a distinct angular orientation of the ingot and melt surface about the axis of rotation;

means for identifying, in at least one acquired perspective-view image, meniscus contour points as-projected into that acquired image;

means for mapping identified meniscus contour points from the perspective-view image projection to the meniscus contour in the physical coordinate system of the ingot;

means for correlating mapped meniscus contour points from at least one acquired image with physical orientations around the meniscus in the physical coordinate system of the ingot, based on the distinct angular orientation corresponding to that image and order position of that image in the image sequence; and means for analyzing the correlated meniscus contour points to determine if a fault condition has occurred.

* * * * *